(12) United States Patent
Yamaoka

(10) Patent No.: US 10,654,222 B2
(45) Date of Patent: May 19, 2020

(54) MANUFACTURING METHOD AND MANUFACTURING APPARATUS FOR SINGLE-SIDED METAL-CLAD LAMINATE

(71) Applicant: KANEKA CORPORATION, Osaka-shi (JP)

(72) Inventor: Tomohiro Yamaoka, Otsu (JP)

(73) Assignee: KANEKA CORPORATION, Osaka-shi (JP)

( * ) Notice: Subject to any disclaimer, the term of this patent is extended or adjusted under 35 U.S.C. 154(b) by 86 days.

(21) Appl. No.: 15/739,907

(22) PCT Filed: Jun. 24, 2016

(86) PCT No.: PCT/JP2016/068861
§ 371 (c)(1),
(2) Date: Dec. 26, 2017

(87) PCT Pub. No.: WO2016/208730
PCT Pub. Date: Dec. 29, 2016

(65) Prior Publication Data
US 2018/0178458 A1 Jun. 28, 2018

(30) Foreign Application Priority Data

Jun. 26, 2015 (JP) ................................. 2015-129288
Sep. 9, 2015 (JP) ................................. 2015-177868

(51) Int. Cl.
*B29C 65/40* (2006.01)
*B32B 27/28* (2006.01)
(Continued)

(52) U.S. Cl.
CPC ............ *B29C 65/40* (2013.01); *B32B 15/088* (2013.01); *B32B 27/281* (2013.01); *B32B 37/06* (2013.01);
(Continued)

(58) Field of Classification Search
USPC ......................................................... 156/247
See application file for complete search history.

(56) References Cited

U.S. PATENT DOCUMENTS

| 4,344,998 A | 8/1982 | de Leeuw et al. |
| 2007/0034326 A1 | 2/2007 | Kikuchi et al. |

(Continued)

FOREIGN PATENT DOCUMENTS

| CN | 1890081 A | 1/2007 |
| CN | 101027345 A | 8/2007 |

(Continued)

OTHER PUBLICATIONS

International Search Report dated Sep. 6, 2016 in PCT/JP2016/068861, 2 pages.

(Continued)

*Primary Examiner* — Sing P Chan
(74) *Attorney, Agent, or Firm* — Oblon, McClelland, Maier & Neustadt, L.L.P.

(57) ABSTRACT

Provided are a manufacturing device and a manufacturing method, for a one-side metal-clad laminated sheet (E), enabling: manufacturing a one-side metal-clad laminated sheet (E) without a thermoplastic resin layer (B) surface, on the side on which metal foil (D) is not laminated, being fused with a metal roller or a protective film even if the thermoplastic resin layers (B) are provided on both sides of a heat-resisting film (A) that is a core layer; and inexpensively and easily obtaining a one-side metal laminated sheet in which warpage is inhibited from occurring.

12 Claims, 7 Drawing Sheets

(51) Int. Cl.
- B32B 37/26 (2006.01)
- H05K 3/00 (2006.01)
- B32B 37/06 (2006.01)
- B32B 15/088 (2006.01)
- H05K 3/02 (2006.01)
- B32B 38/10 (2006.01)
- B32B 37/20 (2006.01)
- B32B 37/12 (2006.01)

(52) U.S. Cl.
CPC ........... *B32B 37/26* (2013.01); *H05K 3/0061* (2013.01); *B32B 37/1284* (2013.01); *B32B 37/203* (2013.01); *B32B 38/10* (2013.01); *B32B 2037/268* (2013.01); *B32B 2309/02* (2013.01); *B32B 2457/08* (2013.01); *H05K 3/022* (2013.01)

(56) References Cited

U.S. PATENT DOCUMENTS

| | | | | |
|---|---|---|---|---|
| 2009/0142607 A1* | 6/2009 | Narui | ................... | B32B 15/08 428/458 |
| 2009/0155610 A1 | 6/2009 | Kaneshiro et al. | | |
| 2009/0197110 A1 | 8/2009 | Kikuchi et al. | | |
| 2013/0011687 A1 | 1/2013 | Matsutani et al. | | |

FOREIGN PATENT DOCUMENTS

| | | |
|---|---|---|
| CN | 101258212 A | 9/2008 |
| CN | 102712187 A | 10/2012 |
| CN | 203919955 U | 11/2014 |
| JP | 2003-311882 A | 11/2003 |
| JP | 2007-109694 A | 4/2007 |
| JP | 2008-251941 A | 10/2008 |
| JP | 2008-272958 A | 11/2008 |
| JP | 2009-66911 A | 4/2009 |
| JP | 2013-176931 A | 9/2013 |

OTHER PUBLICATIONS

International Preliminary Report on Patentability and Written Opinion dated Jan. 4, 2018 in PCT/JP2016/068861 (submitting English translation only), 10 pages.

* cited by examiner

MANUFACTURING METHOD AND MANUFACTURING APPARATUS FOR SINGLE-SIDED METAL-CLAD LAMINATE

TECHNICAL FIELD

The present invention relates to a method for manufacturing a single-sided metal-clad laminate suitably used in a flexible printed circuit board (hereinafter may also be referred to as FPC) or the like, more specifically, to a method and apparatus for manufacturing a single-sided metal-clad laminate by using a heat-resistant film, having on both of its surfaces a thermoplastic resin layer, normally used for forming a double-sided metal-clad laminate.

BACKGROUND ART

As for metal-clad laminates suitably used as printed circuit boards for electronic/electrical devices, conventionally known are a double-sided metal-clad laminate with a structure having a metal foil laminated on both the upper and lower surfaces of a polyimide film, and a single-sided metal-clad laminate, which is a flexible laminate with a structure having a metal foil laminated only on om surface.

When the aforementioned single-sided metal-clad laminate is manufactured by a method such as thermocompression bonding (hereinafter may also be referred to as thermal lamination) using a bonding sheet with a structure having a thermoplastic polyimide layer disposed on both the upper and lower surfaces of the core layer (heat-resistant film), the thermoplastic polyimide layer disposed on the side having no laminated metal foil may cause trouble by melting and sticking to a metallic roll or protective film, making it difficult to manufacture a single-sided metal-clad laminate itself. Therefore, a technology is proposed, using a polyimide with a specific structure for the thermoplastic polyimide layer positioned on the side having no metal foil laminated thereon (Patent Literature 1, for example). Also, another technology is proposed, using a release film on the side having no laminated metal foil and further using a protective film at least either on metallic rolls or lamination materials (Patent Literature 2, for example).

CITATION LIST

Patent Literature

Patent Literature 1: JP2013-176931A (published Sep. 9, 2013)

Patent Literature 2: JP2007-109694A (published Apr. 26, 2007)

SUMMARY OF THE INVENTION

Problems to be Solved by the Invention

However, when a method in Patent Literature 1 is employed, a particular type of polyimide is manufactured and different types of thermoplastic polyimide layers are laminated respectively on the upper and lower surfaces of a heat-resistant film. Accordingly, it is found that the balance in the entire single-sided metal-clad laminate is lowered, for example, trouble such as a difference in linear expansion coefficients occurs, resulting in warping in the single-sided metal-clad laminate. When a method in Patent Literature 2 is employed, in a step for peeling a release film and a protective film, it is found that problems may arise, for example, insufficient peeling of the release film and protective film from the single-sided metal-clad laminate, wrinkles on the single-sided metal-clad laminate, and so on.

A single-sided metal-clad laminate may also be formed by using a double-sided metal-clad laminate and by etching away the metal foil only from either side. However, performing etching means an extra step added to the manufacturing process in such a method. Moreover, there are issues of supply and cost related to unnecessary metal foil that is eventually etched away.

The present invention was carried out in consideration of the aforementioned problems. Its objective is to provide a method and an apparatus for manufacturing a single-sided metal-clad laminate: even when a thermoplastic resin layer is disposed on both surfaces of a heat-resistant film which is the core layer, the surface of a thermoplastic resin layer having no metal foil laminated thereon is prevented from melting and sticking to a metallic roll or a protective film so that a single-sided metal-clad laminate, which is suppressed from warping, is efficiently manufactured in a simplified method at lower cost.

Solutions to the Problems

The inventors of the present invention have conducted intensive studies to solve the aforementioned problems and found that the method below is capable of solving those problems and providing a desired single-sided metal-clad laminate (E), and have completed the present invention accordingly.

Namely, a method for manufacturing a single-sided metal-clad laminate (E) related to the present invention is characterized by including the following steps: using an adhesive sheet (C) having a thermoplastic resin layer (B) on both surfaces of a heat-resistant film (A), a step for laminating a metal foil (D) via a thermoplastic resin layer (B) on a surface of the adhesive sheet (C), and a step for laminating a protective material (G) via a thermoplastic resin layer (B) on the side of adhesive sheet (C) having no metal foil (D) laminated thereon, and further including a step for peeling the protective material (G). In such a manufacturing method, an angle ($\alpha$), made by the single-sided metal-clad laminate (E) prior to peeling the protective material (G) and the peeled protective material (G), is set greater than 0° but smaller than 90°.

An apparatus for manufacturing a single-sided metal-clad laminate (E) related to the present invention is characterized by including a thermal lamination section for thermally laminating an adhesive sheet (C) having a thermoplastic resin layer (B) on both surfaces of a heat-resistant film (A), a metal foil (D) disposed via a thermoplastic resin layer (B) on a surface of the adhesive sheet, and protective material (G) disposed via a thermoplastic resin layer (B) on the side of adhesive sheet (C) having no metal foil (D) laminated thereon; and a protective-material peeling section located on the downstream side for peeling the protective material (G) from the single-sided metal-clad laminate (E). In such a manufacturing apparatus, the protective-material peeling section is so structured that an angle ($\alpha$), made by the single-sided metal-clad laminate (E) prior to peeling the protective material (G) and the peeled protective material (G), is set to be greater than 0° but smaller than 90°.

Effects of the Invention

According to the present invention, it is easier to manufacture a single-sided metal-clad laminate by employing a material and apparatus conventionally used for manufacturing a double-sided metal-clad laminate. Moreover, since there is no need to etch the metal foil off one surface, productivity is enhanced at lower cost. The manufacturing method related to the present invention is notably effective, especially for continuously manufacturing a single-sided metal-clad laminate by a thermal lamination method.

DETAILED DESCRIPTION OF THE EMBODIMENTS

Figure 1:
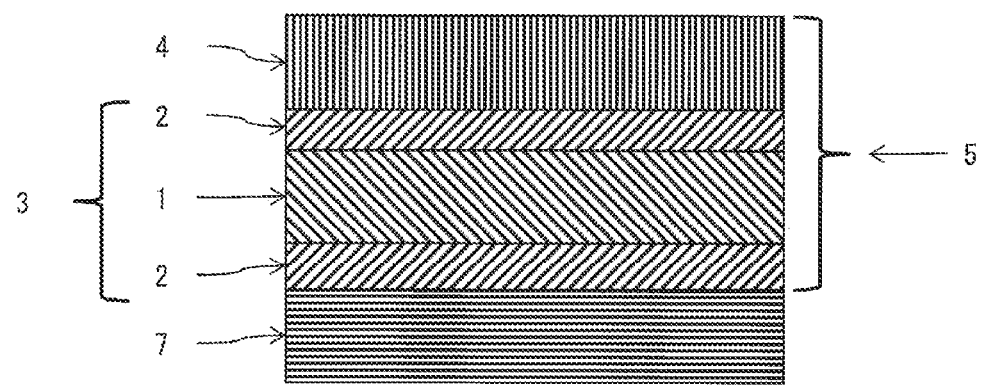
FIG. 1 is an enlarged cross-sectional view schematically showing a thermocompressed single-sided metal-clad laminate (E) manufactured according to an embodiment of the present invention; after thermocompression bonding, the protective material (G) is peeled from the single-sided metal-clad laminate (E).

Embodiments of the present invention are described below in detail. However, those embodiments are not the only options, and the present invention may also be practiced through various modifications that are made within the scope described below.

In the present application, "A~B" showing a range of numerical values means "(A) or greater (including (A) and values greater than (A)), but (B) or smaller (including (B) and values smaller than (B))" unless otherwise specified.

<Heat-Resistant Film (A)>

In the present invention, "heat resistance" means having the ability to withstand heating temperatures during thermal lamination. Therefore, as for a heat-resistant film (A), it is not limited to any particular type as long as it satisfies the above definition. Various known films such as polyimide films and polyethylene naphthalate may be used. Especially, a heat-resistant film (A) is preferred to be a heat-resistant polyimide film since it exhibits excellent physical properties such as electrical properties in addition to heat resistance.

Regarding the "heat-resistant polyimide film," as long as it is formed to contain a non-thermoplastic polyimide at 90 wt. % or greater, the molecular structure of the non-thermoplastic polyimide and its thickness are not limited particularly. The non-thermoplastic polyimide used for forming a heat-resistant polyimide film is generally manufactured by using a polyamide acid (may also be referred to as polyamic acid) as its precursor. The non-thermoplastic polyimide may be fully imidized, or may in part contain a non-imidized precursor, namely, a polyamic acid. Here, a non-thermoplastic polyimide generally indicates a polyimide that does not soften or become adhesive when heated. In the present invention, a non-thermoplastic polyimide refers to such a polyimide that maintains the shape of a film without being wrinkled or expanded when heated at 450° C. for 2 minutes, or to a polyimide having virtually no glass transition temperature. The glass transition temperature is determined from the value at the inflection point in the storage modulus measured by a dynamic viscoelasticity measuring device (DMA). In addition, "having virtually no glass transition temperature" means thermal decomposition starts prior to entering a glass transition state.

Generally, polyimide films are manufactured by using a polyamic acid as its precursor. Any known method may be employed for manufacturing a polyamic acid. Usually, substantially equimolar amounts of an aromatic tetracarboxylic dianhydride and an aromatic diamine are dissolved in an organic solvent and stirred under controlled temperature conditions until polymerization of the aromatic tetracarboxylic dianhydride and aromatic diamine is completed. A polyamic acid solution is usually obtained at a concentration of 5 wt. %~35 wt. %, preferably 10 wt. %~30 wt. %. When the concentration is in such a range, the molecular weight and solution viscosity are each achieved in a preferred range.

As for the polymerization method, any known method or combination thereof may be used. A method for polymerizing a polyamic acid is characterized by the order of adding monomers. By controlling the order of adding monomers, various physical properties of the obtained polyimide ate controlled. In the present invention, any method for adding monomers may be employed for polymerizing a polyamic acid. Typical polymerization methods are as follows:

1) a polymerization method, in which an aromatic diamine is dissolved in an organic polar solvent, and then reacted with a substantially equimolar amount of an aromatic tetracarboxylic dianhydride;

2) a polymerization method, in which an aromatic tetracarboxylic dianhydride is reacted with an overly small molar amount of an aromatic diamine compound in an organic polar solvent to obtain a prepolymer having an anhydride group at both of its terminals, and then the aromatic diamine compound is added so as to make its amount substantially equimolar with the aromatic tetracarboxylic dianhydride in the entire process;

3) a polymerization method, in which an aromatic tetracarboxylic dianhydride is reacted with an overly large molar amount of an aromatic diamine compound in an organic polar solvent to obtain a prepolymer having an amino group at both of its terminals, and then the aromatic tetracarboxylic dianhydride is added so as to make its amount substantially equimolar with the aromatic diamine compound in the entire process;
4) a polymerization method, in which an aromatic tetracarboxylic dianhydride is dissolved and/or dispersed in an organic polar solvent, and then reacted with a substantially equimolar amount of an aromatic diamine compound;
5) a polymerization method, in which a mixture, prepared using substantially equimolar amounts of an aromatic tetracarboxylic dianhydride and an aromatic diamine, is reacted in an organic polar solvent; and the like. Those methods may be used alone or by partially combining two or more methods.

In the present invention, the polymerization method is not limited particularly, and a polyamic acid obtained by using any of the above polymerization methods may be used.

Examples of the aromatic diamine are, but are not limited to, the following: 3,3'-diaminodiphenyl ether, 3,4'-diaminodiphenyl ether, 4,4'-diaminodiphenyl ether, 2,2-bis {4-(4-aminophenoxy) phenyl}propane, 2,2-bis{4-(4-aminophenoxy) phenyl}hexafluoropropane, bis {4-(3-aminophenoxy) phenyl}sulfone, bis {4-(4-aminophenoxy) phenyl}sulfone, 1,3-bis(3-aminophenoxy)benzene, 1,3-bis(40aminophenoxy)benzene, 1,4-bis(4-aminophenoxy)benzene, 3,3'-diaminobenzophenone, 4,4'-diaminobenzophenone, 3,3'-dichlorobenzidine, 3,3'-dimethylbenzidine, 2,2'-dimethylbenzidine, 3,3'-dimethoxybenzidine, 2,2'-dimethoxybenzidine, 1,4-diaminobenzene(p-phenylenediamine), 1,3-diaminobenzene(m-phenylenediamine), 4,4'-diaminodiphenylsulfone, 3,3'-diaminodiphenylsulfone, 9,9-bis(4-aminophenyl)fluorene, 4,4'-(1,4-phenylene bis(1-methyl ethylidene))bisaniline, 4,4'-(1,3-phenylene bis(1-methyl ethylidene))bisaniline, 4,4'-diaminobenzanilide, and the like. They may be used alone or in combination thereof.

Furthermore, examples of the aromatic tetracarboxylic dianhydride are, but are not limited to, the following: 3,3',4,4'-benzophenone tetracarboxylic dianhydride, 2,2',3,3'-benzophenone tetracarboxylic dianhydride, 4,4'-oxydiphthalic dianhydride, 3,4'-oxyphthalic dianhydride, ethylen-ebis(trimellitic monoester anhydride, bisphenol A bis (trimellitic monester anhydride) pyromellitic dianhydride, 2,3,6,7-naphthalene tetracarboxylic dianhydride, 1,4,5,8-naphthalene tetracarboxylic dianhydride, 3,3',4,4'-diphenylsulfone tetracarboxylic dianhydride, 3,3',4,4'-dimethyl diphenyl silane tetracarboxylic dianhydride, 3,3',4,4'-tetraphenyl silane tetracarboxylic dianhydride, 1,2,3,4-furan tetracarboxylic dianhydride, 4,4'-bis(3,4-dicarboxyphenoxy) diphenylpropane dianhydride, 4,4'-hexafluoroisopropylidene diphthalic anhydride, 3,3',4,4'-biphenyltetracarboxylic dianhydride, 2,3,3',4'-biphenyltetracarboxylic dianhydride, p-phenylene bis (trimellitic monoester anhydride), p-phenylene diphthalic anhydride, and the like. They may be used alone or in combination thereof.

It is sufficient if substantially equimolar amounts of the above aromatic diamine and aromatic tetracarboxylic dianhydride are reacted. The order of adding them, the combination and composition of monomers are not limited particularly.

The organic solvent used for a polymerization solvent to manufacture a polyamic acid is not limited particularly as long as it dissolves aromatic diamine, aromatic tetracarboxylic dianhydride and the resultant polyamic acid. As the polymerization solvent, amide solvents such as N,N-dimethylformamide, N,N-diethylformamide, N,N-dimethylacetamide, N-methyl-2-pyrrolidone, and the like are preferred. When a solvent such as above is used, a resin solution is prepared by using the obtained organic solvent solution of a polyamic acid (polyamic acid solution) as is.

The reaction temperature for producing a polyamic acid is preferred to be −10° C. to 50° C. It is preferred to set the temperature in such a range, since a reaction progresses at an excellent rate and excellent productivity is achieved. In addition, the reaction time is not limited particularly, and it is usually a few minutes to a few hours.

In the present invention, a curing agent refers to those containing at least either of a dehydration agent and catalyst.

Note that a dehydration agent is not limited to any particular type as long as it is capable of dehydrating a polyamic acid through a ring-closing dehydration reaction: examples are aliphatic anhydrides, aromatic anhydrides, N,N-dialkyl carbodiimide, lower aliphatic halides, halogenated lower aliphatic anhydrides, arylsulfonic dihalides, thionyl halides and the like. Those may be used alone or by appropriately combining two or more. Among the above, aliphatic anhydrides and aromatic anhydrides are especially preferable.

A catalyst is not limited particularly, as long as its components are effective for facilitating the ring-closing dehydration of a polyamic acid by the dehydration agent. Specific examples are aliphatic tertiary amines, aromatic tertiary amines, heterocyclic tertiary amines, and the like.

To improve various properties of a film such as slidability, thermal conductivity, electrical conductivity, corona resistance and loop stiffness, it is an option to add a filler to the heat-resistant film (A). Any type of filler may be used, but preferred examples are silica, titanium oxide, alumina, silicon nitride, boron nitride, calcium hydrogen phosphate, calcium phosphate, mica, and the like.

<Thermoplastic Resin Layer (B)>

As for a thermoplastic resin layer (B) in the present invention, polycarbonate resins, acrylonitrile, styrene copolymer resins, thermoplastic polyimide resins or the like may be used. From the viewpoint of heat resistance, thermoplastic polyimide resins are especially preferred. As long as desired properties such as a significant adhesiveness with metal foil and a preferable linear expansion coefficient are expressed, the content and molecular structure of the thermoplastic polyimide resin contained in the layer and its thickness are not limited particularly. However, from a practical point of view, a thermoplastic resin layer (B) is preferred to contain 50 wt % or more of a thermoplastic polyimide resin to express desired properties such as a significant adhesiveness and a preferable linear expansion coefficient. However, the thermoplastic polyimide resin contained in the thermoplastic resin layers (B) positioned facing each other across a heat-resistant film are preferred to be the same type in view of balancing linear expansion coefficients of the entire adhesive sheet and simplifying production steps and the like.

Preferred examples of the thermoplastic polyimide resin contained in a thermoplastic resin layer (B) are thermoplastic polyamide-imides, thermoplastic polyether imides, thermoplastic polyester imides and the like.

A thermoplastic polyimide contained in a thermoplastic resin layer (B) is obtained through a conversion reaction from a polyamic acid, which is the precursor of a thermoplastic polyimide. To produce a polyamic acid, any known method may be employed, the same as in producing precursors of non-thermoplastic polyimide resins available to be used in the heat-resistance film (A).

From the viewpoint of expressing a significant adhesiveness with a metal foil (D), while not inhibiting heat resistance of the obtained single-sided metal-clad laminate (E), the thermoplastic polyimide resin used in the present invention is preferred to have a glass transition temperature (Tg) in a range of 150° C.~300° C. The glass transition temperature is determined from the value at the inflection point in the storage modulus measured by a dynamic viscoelasticity measuring device (DMA).

A polyamic acid as the precursor of a thermoplastic polyimide available for use in the present invention is not limited particularly, and any known polyamic acid may be used. A polyamic acid solution may be prepared by appropriately selecting raw materials and production conditions listed above.

Various characteristics of a thermoplastic polyimide are adjustable by selecting various combinations of raw materials such as an aromatic tetracarboxylic dianhydride and an aromatic diamine. Generally speaking, a higher ratio in using an aromatic diamine having a rigid structure may raise the glass transition temperature or increase the storage modulus during heating, likely leading to lower adhesiveness and processability. For example, the ratio in using the aromatic diamine with a rigid structure is preferred to be 40 mol % or less, more preferably 30 mol % or less, especially preferably 20 mol % or less, of the entire amount of aromatic diamine.

Specific examples of aromatic diamines and aromatic tetracarboxylic dianhydrides used in a preferred thermoplastic polyimide resin are the above-listed aromatic diamines and aromatic tetracarboxylic dianhydrides to be used for forming the above-mentioned heat-resistant polyimide film. More preferred examples are those obtained when dianhydrides, for example, benzophenone tetracarboxylic dianhydride, biphenyl tetracarboxylic dianhydride, oxydiphthalic dianhydride, biphenylsulfone tetracarboxylic dianhydride and the like, are polymerized with an aminophenoxy group-containing aromatic diamine, and so on.

Moreover, to control slidability of the adhesive sheet related to the present invention, inorganic or organic filler or other resins may be added if applicable.

<Method for Producing Adhesive Sheet (C)>

The method for producing an adhesive sheet (C) related to the present invention is not limited particularly, a triple-layered adhesive sheet (C), for example, may be prepared by forming a thermoplastic resin layer (B) on one side at a time or on both sides simultaneously of a heat-resistant film (A) as the core layer, by molding a thermoplastic resin layer (B) into a sheet and laminating it on surfaces of a heat-resistant film (A) as the core layer, and so on. Alternatively, a heat-resistant film (A) as the core layer and thermoplastic resin layers (B) are extruded together to form a laminate substantially in one step so as to obtain an adhesive sheet (C).

Also, if a thermoplastic polyimide resin is used as the thermoplastic resin layer (B), for example, the thermoplastic polyimide resin or a resin composition containing the resin may be dissolved or dispersed in an organic solvent to prepare a resin solution, which is then coated on surfaces of a heat-resistant film (A). It is also an option to prepare a solution of a polyamic acid, which is the precursor of a thermoplastic polyimide, and to coat the solution on surfaces of a heat-resistant film and then imidize it. In such a method, conditions for synthesizing a polyamic acid and imidizing the polyamic acid are not limited particularly, and conventionally known raw materials and conditions may be applied. If excessive heat is applied on a polyamic acid during the calcination process, tackiness is lowered, but problems such as a hike in the moisture absorption rate and deterioration of the film may arise. In addition, the polyamic acid solution may contain a coupling agent, for example, if applicable.

The thickness of each layer in an adhesive sheet (C) related to the present invention may be adjusted appropriately so as to prepare the entire thickness to be suitable for usage purposes. The thickness of each thermoplastic resin layer (B) is preferred to be adjusted in consideration of the linear expansion coefficient of each layer so that warping does not occur in the adhesive sheet (C). When the difference in linear expansion coefficients is small between a heat-resistant film (A) and thermoplastic resin layers (B) positioned facing each other across from heat-resistant film (A), it is easier to balance their thicknesses. The entire thickness of an adhesive sheet (C) is preferred to be 5 μm~50 μm, more preferably 7 μm~30 μm. Within such a range, the adhesive sheet (C) is preferably used as the substrate of FPCs.

As the adhesive sheet (C) related to the present invention, Pixio® made by Kaneka Corporation may also be used.

<Metal Foil (D)>

The metal foil (D) in the present invention is not limited to any particular type. When a single-sided metal-clad laminate (E) related to the present invention is used in electronic/electrical devices, foils made of, for example copper or copper alloys, stainless steel or its alloys, nickel or nickel alloys (including alloy 42), or aluminum or aluminum alloys may be used. Generic metal-clad laminates often use copper foils such as rolled copper foils and electrolytic copper foils. Those copper foils may also be used preferably as the metal foil (D) in the present invention. Note that an anticorrosion layer, heat-resistant layer or adhesive layer may be coated on surfaces of such a metal foil (D). The thickness of the metal foil (D) is not limited particularly, as long as the foil exhibits sufficient functions corresponding to usage purposes. For example, the thickness of a metal foil (D) is preferred to be 3 μm~30 μm, more preferably 5 μm~20 μm. The surface toughness (Rz) of a metal foil (D) is preferred to be 0.01 μm~1 μm. If the surface toughness (Rz) of a metal foil (D) is outside such a range, the adhesiveness with a thermoplastic resin layer (B) may be lowered.

<Protective Film (F)>

In the present invention, regarding the side to laminate metal foil (D), it is preferred to laminate a metal foil (D) via a thermoplastic resin layer (B) and to further laminate a protective film (F) to be in contact with the metal foil (D) so that the obtained single-sided metal-clad laminate (E) is given an excellent appearance. Specifically, when a thermocompression bonding method is used, a protective film (F) is laminated between the compression surface (metallic roll, for example) and the adhesive sheet (C) and metal foil (D). In other words, a protective film (F) is laminated between the compression surface (metallic roll, for example) and metal foil (D).

As long as it is resistant to the heating temperature in the thermocompression bonding process, a protective film (F) is not limited to a particular type. Preferred examples are heat-resistant plastics such as non-thermoplastic polyimide film, metal foils such as copper foil, aluminum foil, SUS foil and the like. Among those, a non-thermoplastic polyimide film is more preferred since it provides excellent balance in heat resistance, recyclability and the like. Various known films are available for a non-thermoplastic polyimide film; for example, Apical®, made by Kaneka Corporation, Upilex® made by Ube Industries, Ltd., Kapton® made by Du Pont Toray Co., Ltd., and the like.

A protective film (F) is not limited to have any particular thickness as long as it has a thickness capable of presenting problems such as the single-sided metal-clad laminate (E) peeling off the protective film (F) in a step for peeling a protective material (G). The thickness is preferred to be 25 μm~300 μm, more preferably 50 μm~250 μm.

<Protective Material (G)>

In the present invention, a protective material (G) is directly laminated on a thermoplastic resin layer (B) on the side of an adhesive sheet (C) having no metal foil (D) laminated thereon. More specifically, a protective material (G) is laminated between a compression surface (metallic roll, for example) and the adhesive sheet (C).

As long as it is resistant to the heating temperature during a thermocompression bonding step, a protective material (G) is not limited to any particular type; preferred examples are heat-resistant plastics such as a non-thermoplastic polyimide film, metal foils such as copper foil, aluminum foil, SUS foil and the like. Among those, a non-thermoplastic polyimide film is more preferred since it provides excellent balance in heat resistance, recyclability and the like.

A protective material (G) is not limited to have any particular thickness as long as it has a thickness capable of preventing problems such as the single-sided metal-clad laminate (E) peeling off the protective material (G) in a step for peeling a protective film (F). The thickness is preferred to be 10 μm~300 μm, more preferably 25 μm~300 μm, even more preferably 50 μm~250 μm.

Various known films are available for a non-thermoplastic polyimide film; for example, Apical®, made by Kaneka Corporation, Upilex® made by Ube Industries, Ltd., Kapton® made by Du Pont Toray Co. Ltd., and the like.

<Linear Expansion Coefficient of Protective Material (G)>

When the linear expansion coefficient of the adhesive sheet (C) is set as (X1) and the linear expansion coefficient of protective material (G) as (X2) in the present invention, it is preferred to use a protective material (G) having |X1−X2|≥3 ppm/° C. When the linear expansion coefficient (X2) of protective material (G) is in a range that satisfies the above formula, the adhesive sheet (C) is prevented from curling after the protective material (G) is peeled in a wind-up step, or after an etching step, if necessary, is conducted. Preferably, |X1−X2| is 3 ppm/° C.~15 ppm/° C., more preferably 4 ppm/° C.~12 ppm/° C. by controlling the linear expansion coefficient of the entire adhesive sheet (C), warping is suppressed from occurring in the obtained single-sided metal-clad laminate (E). Even more preferably, |X1−X2| is 4.5 ppm/° C.~8.5 ppm/° C., more preferably 5 ppm/° C.~8 ppm/° C. In such a range, warping is suppressed from occurring in the obtained single-sided metal-clad laminate (E), and the rate in dimensional change is also reduced.

<Surface Roughness of Protective Material (G)>

In the present invention, the surface roughness of a protective material (G) is preferred to be in a range of 0.01 μm~3 μm, more preferably 0.01 μm~1 μm. when a protective material (G) has a surface roughness in such a range, it is easier to peel the adhesive sheet (C) and protective material (G), and the obtained single-sided metal-clad laminate (E) is suppressed from curling. Note that the surface roughness of a protective material (G) refers to that of the surface where the protective material (G) makes contact with the adhesive sheet (C).

<Method for Manufacturing Single-Sided Metal-Clad Laminate (E)>

Figure 2:
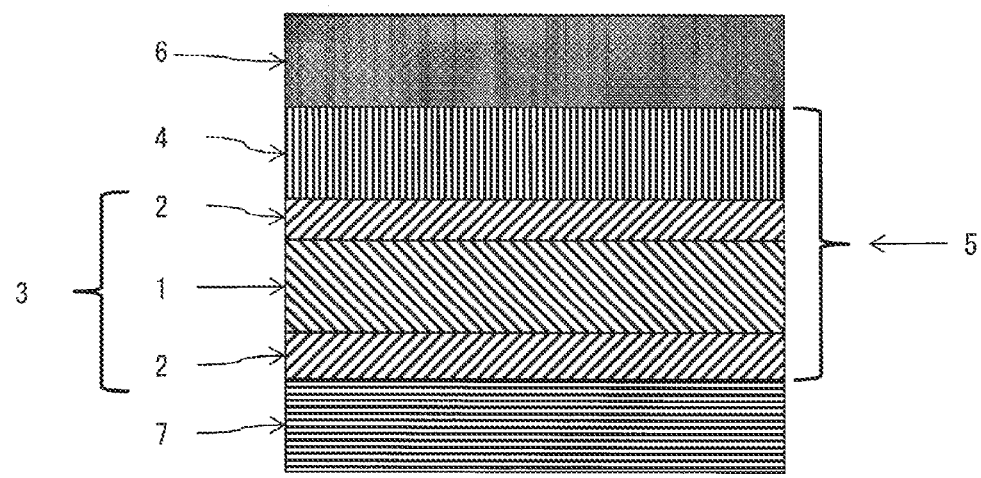
FIG. 2 is an enlarged cross-sectional view schematically showing a thermocompressed single-sided metal-clad laminate (E) manufactured according to an embodiment of the present invention; after thermocompression bonding, the protective film (F) and protective material (G) are peeled from the single-sided metal-clad laminate (E)

The manufacturing method of a single-sided metal-clad laminate (E) related to the present invention is described as follows by referring to FIGS. 1 and 2, for example: using adhesive sheet (C) 3 having thermoplastic resin layer (B) 2 on both surfaces of heat-resistant film (A) 1, single-sided metal-clad laminate (E) 5 is manufactured by laminating metal foil (D) 4 via thermoplastic resin layer (B) 2 on a surface of adhesive sheet (C) 3. The method is characterized in that on the side to laminate metal foil (D) 4, metal foil (D) 4 is laminated via thermoplastic resin layer (B) 2, whereas on the side not to laminate metal foil (D) 4, protective material (G) 7 is directly laminated on thermoplastic resin layer (B) 2. Regarding the side to laminate metal foil (D) 4, after laminating metal foil (D) 4 via thermoplastic resin layer (B) 2, it is an option to further laminate protective film (F) 6 to be in contact with metal foil (D) 4.

Various known methods may be employed for the lamination method, but thermocompression bonding of the above layers is preferred, since wrinkles or the like are suppressed from occurring in the obtained single-sided metal-clad laminate (E). Available methods for laminating an adhesive sheet (C) and metal foil (D) are, for example, thermocompression bonding in batches by using a single plate press, continuous thermocompression bonding by using a hot roll laminator (also known as a thermal lamination machine) or a double-belt press (DBP), and the like. From the viewpoints of productivity and running costs including the maintenance cost, a preferred method is thermocompression bonding using a hot roll laminator equipped with one or more pairs of metallic rolls. Here, "hot roll laminator equipped with one or more pairs of metallic rolls" is not limited to having any specific structure as long as the device has metallic rolls for thermally compressing materials.

The manufacturing method of a single-sided metal-clad laminate (E) related to the present invention may include a step for heating an adhesive sheet (C) before the above layers are laminated. The method for heating an adhesive sheet (C) is not limited particularly; for example, a heater may be used. A heater for the above heating process is preferred to be positioned on the side where a protective material (G) is to be laminated on the adhesive sheet (C). Such heating is preferred, since an appropriate peel strength is obtained, resulting in excellent peeling behavior. The adhesive sheet (C) is preferred to be heated at a temperature of 250° C. or higher, more preferably 300° C. or higher, even more preferably 400° C. or higher. The upper limit is preferred to be 550° C. or lower, more preferably 500° C. or lower. Heating the adhesive sheet (C) in such a temperature range makes it even easier to peel the protective material (G). Also, drooping or wrinkling of the single-sided metal-clad laminate (E) is more appropriately prevented. The heating time is not limited particularly, either, and is preferably 0.1 minute~1 minute.

In the step following the thermocompression bonding, it may be an option to use the single-sided metal-clad laminate (E) with at least either the protective film (F) or protective material (G) remaining thereon. However, for use as an FPC, it is found notably important to peel either or both of the protective material (G) and protective film (D) from the single-sided metal-clad laminate (E) in order to simplify the production process.

Figure 3:
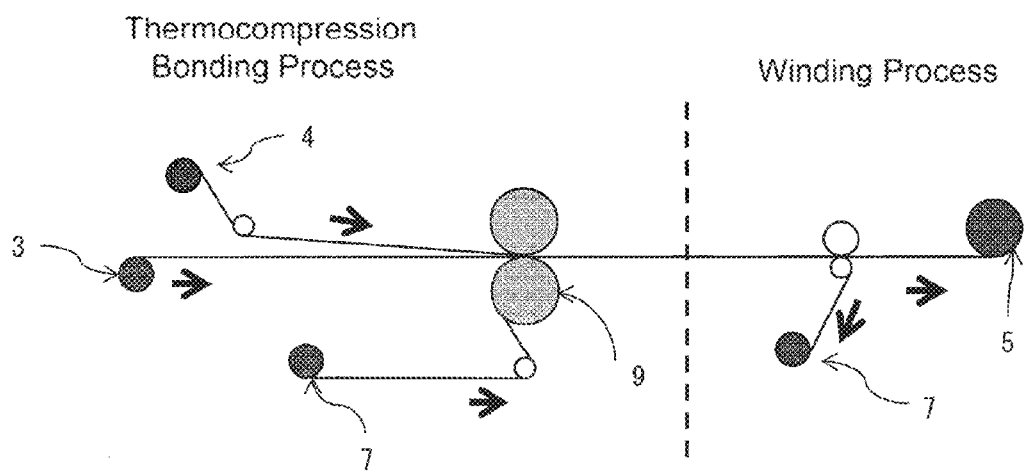
FIG. 3 is a cross-sectional view schematically showing a preferred example of the method (apparatus) used in the present invention for manufacturing a single-sided metal-clad laminate (E)
Figure 4:
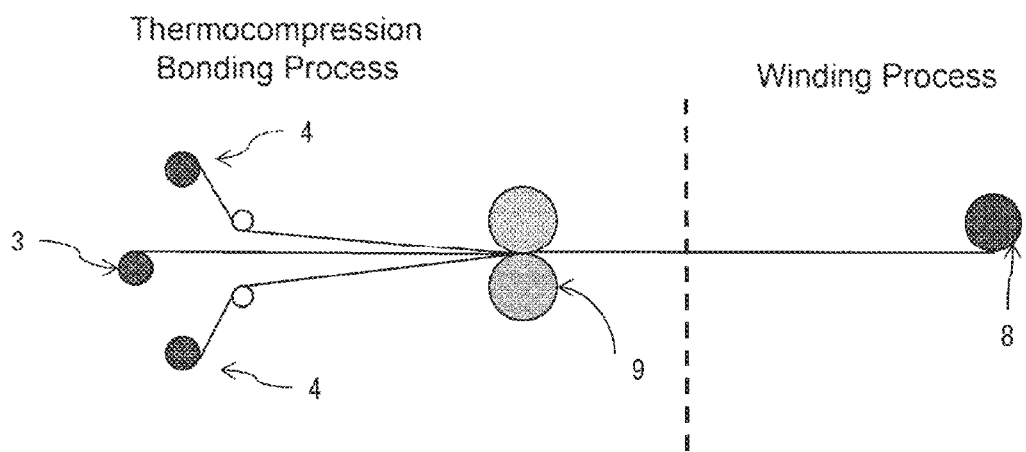
FIG. 4 is a cross-sectional view schematically showing an example of a conventional method (apparatus) for manufacturing a double-sided metal-clad laminate.

Therefore, a preferred embodiment of the manufacturing method for a single-sided metal-clad laminate (E) related to the present invention includes the following steps as shown in FIG. 3 by using adhesive sheet (C) 3 having a thermoplastic resin layer (B) on both surfaces of a heat-resistant film (A), a step for laminating only metal foil (D) 4 via a thermoplastic resin layer (B) on a surface of adhesive sheet (C) 3, while laminating protective material (G) 7 via a thermoplastic resin layer (B) on the side of adhesive sheet (C) 3 having no metal foil (D) 4 laminated thereon; and the method further includes a step for peeling protective material (G) 7.

Figure 5:
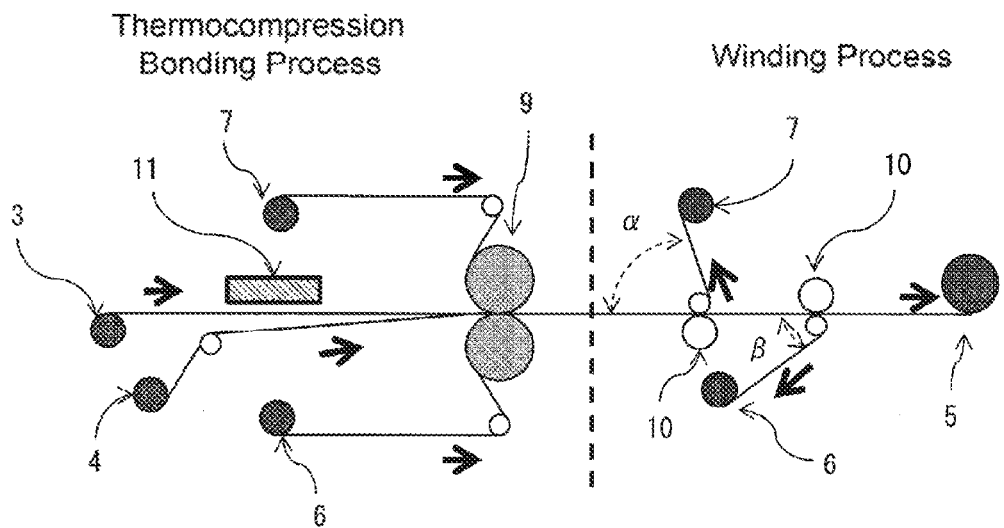
FIG. 5 is a cross-sectional view schematically showing a preferred example of the method (apparatus) used in the present invention for manufacturing a single-sided metal-clad laminate (E)

Moreover, another preferred embodiment of the manufacturing method for a single-sided metal-clad laminate (E) related to the present invention includes the following steps as shown in FIG. 5: by using adhesive sheet (C) 3 having a thermoplastic resin layer (B) on both surfaces of a heat-resistant film (A), a step for laminating metal foil (D) 4 via a thermoplastic resin layer (B) on a surface of adhesive sheet (C) 3, and further laminating protective film (F) 6 to be in contact with the metal foil (D) 4, while laminating protective material (G) 7 via a thermoplastic resin layer (B) on she side of the adhesive sheet (C) 3 having no metal foil (D) 4 laminated thereon; and the method further includes a step for peeling protective material (G) 7 and protective film (F) 6.

Especially, it is preferred to peel the protective material (G) first from the single-sided metal-clad laminate (E) and then to peel the protective film (F), since wrinkles and warping are far less likely to occur in the single-sided metal-clad laminate (E). It is an option to simultaneously peel the protective material (G) and protective film (F) from the single-sided metal-clad laminate (E). However, when the protective material (G) and protective film (F) protecting both surfaces of the single-sided metal-clad laminate (E) are simultaneously peeled such a process causes unstable transportation of the single-sided metal-clad laminate (E), and wrinkles and warping may occur in the single-sided metal-clad laminate (E), thus resulting in poor-quality FPCs. Moreover, if the protective film (F) is peeled first from the single-sided metal-clad laminate (E) and then the protective material (G) is peeled, the single-sided metal-clad laminate (E) is left in a lamination condition with the protection material (G), which is relatively thinner and has a lower rigidity, when the protective film (F) is peeled. Accordingly, if the protective material (G) is peeled later, wrinkles and warping are more likely to occur in the single-sided metal-clad laminate (E).

The above mechanism is assumed to stem in part from the adhesive strength (peel strength) between the protective material (G) and single-sided metal-clad laminate (E) and the adhesive strength (peel strength) between the protective film (F) and single-sided metal-clad laminate (E).

Figure 12:
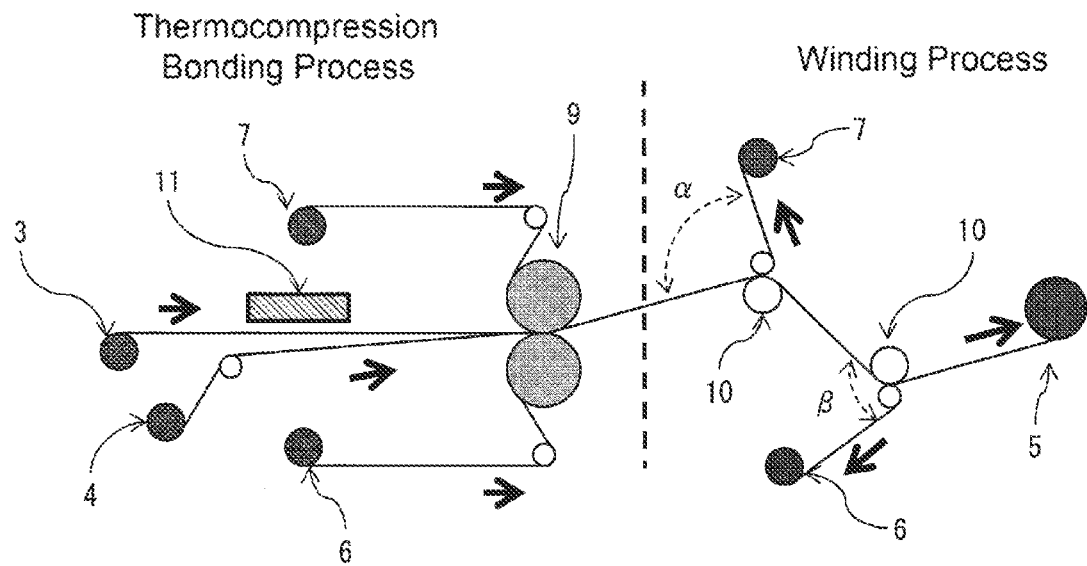
FIG. 12 is a cross-sectional view schematically showing an example of the method (apparatus) used in the present invention for manufacturing a single-sided metal-clad laminate (E).

Moreover, in addition to the order of peeling the protective material (G) and protective film (F) from the single-sided metal-clad laminate (E), the peel angle, that is, the angle made by the protective material (G) and single-sided metal-clad laminate (E) or the angle made by the protective film (F) and single-sided metal-clad laminate (E), is found to notably affect the quality, especially the occurrence of wrinkles and warping, of single-sided metal-clad laminate (E) after protective material (G) and protective film (F) are peeled. In other words, the angle ($\alpha$), made by the single-sided metal-clad laminate (E) prior to peeling the protective material (G) and the peeled protective material (G), is preferred to be greater than 0° but smaller than 90°. Note that if a later-described meandering pass line is employed, ($\alpha$) is the angle made by single-sided metal-clad laminate (E) shortly before peeling protective material (G) and resultant peeled protective material (G) are shown in FIG. 12. The angle ($\alpha$) in the above range is preferable since the peel strength is reduced between the protective material (G) and single-sided metal-clad laminate (E), thus enabling the protective material (G) to be appropriately peeled off the single-sided metal-clad laminate (E). The angle ($\alpha$) is more preferred to be 10° or greater but smaller than 80°, even more preferably 10° or greater but smaller than 70°, especially preferably 10° or greater but smaller than 60°.

When protective material (G) is peeled by being pulled at the above angle ($\alpha$) relative to single-sided metal-clad laminate (E) prior to a peeling process (later described method (I)), the peel strength between the protective material (G) and single-sided metal-clad laminate (E) is preferred to be 0.01 N/cm~1.8 N/cm, more preferably 0.05 N/cm~0.2 N/cm. When a single-sided metal-clad laminate (E), more specifically, a laminate of an adhesive sheet (C) and a metal foil (D), is peeled at the above angle (180°-$\alpha$) relative to the protective material (G) prior to the peeling process (later-described method (II)), the above peel strength is preferred to be 0.01 N/cm~2.0 N/cm, more preferably 0.05 N/cm~0.2 N/cm. It is preferred for the peel strength to be under the aforementioned upper limit between a protective material (G) and single-sided metal-clad laminate (E) so as to prevent problems such as the protective material (G) remaining partially on the single-sided metal-clad laminate (E) or being unable to be peeled. It is preferred for the peel strength to be above the aforementioned lower limit between a protective material (G) and single-sided metal-clad laminate (E) so as to prevent problems such as the protective material (G) peeling off or buckling from the single-sided metal-clad laminate (E) during the process to cause wrinkles.

Moreover, in an embodiment where the protective material (G) and protective film (F) are peeled from the single-sided metal-clad laminate (E), it is preferred for the angle ($\alpha$), are peeled from the single-sided metal-clad laminate (E) prior to peeling the protective material (G) and the peeled material (G), to be set greater than 0° but smaller than 90°, while it is preferred for the angle ($\beta$), made by the single-sided metal-clad laminate (E) prior to peeling protective film (F) and the peeled film (F), to be set greater than 0° but smaller than 90°. The angle ($\alpha$) is described earlier above, and its description is omitted here. Note that if a later-described meandering pass line is employed, ($\beta$) is the angle made by single-sided metal-clad laminate (E) shortly before peeling protective film (F) and the peeled protective film (F) as shown in FIG. 12. If the angle ($\beta$0 is set in such a range, the protective film (F) is not peeled during the production process even after the protective material (G) is peeled. Besides, the protective film (F) does not remain on single-sided metal-clad laminate (E) during the peeling process. In addition, the angle ($\beta$) is preferred to be acute, since warping is less likely to occur in the obtained single-sided metal-clad laminate (E). The angle ($\beta$) is preferred to be 10° or greater but smaller than 80°, more preferably 10° or greater but smaller than 70°, especially preferably 10° or greater but smaller than 60°.

When the protective film (F) is peeled by being pulled at the above angle ($\beta$) relative to single-sided metal-clad laminate (E) prior to the peeling process (later described method (I)), the peel strength between the protective film (F) and single-sided metal-clad laminate (E) is preferred to be 0.01 N/cm~1.8 N/cm, more preferably 0.05 N/cm~0.2 N/cm. When a single-sided metal-clad laminate (E), more specifically a laminate of an adhesive sheet (C) and a metal foil (D), is peeled at the above angle (180°-$\beta$) relative to the protective film (F) prior to being peeled (later describe method (II), the above peel strength is preferred to be 0.01 N/cm~2.0 N/cm, more preferably 0.5 N/cm~0.2 N/cm. It is preferred for the peel strength to be under the aforementioned upper limit between the protective film (F) and single-sided metal-clad laminate (E) so as to prevent problems such as protective film (F) remaining partially on single-sided metal-clad laminate (E) or being unable to peel. It is preferred for the peel strength to be above the aforementioned lower limit between protective film (F) and single-sided metal-clad laminate (E) so as to prevent trouble such as protective film (F) peeling or buckling off single-sided metal-clad laminate (E) during the process to cause wrinkles.

Occurrence of wrinkles or warping in the single-sided metal-clad laminate (E) may be affected by the type and thickness of copper foil. For example, if it is a rolled copper foil, ($\alpha$) is preferred to be in a range of 10°~80°. Rolled copper foils generally have better flexibility than electrolytic copper foils with the same thickness, but because of their flexibility they are thought to be affected by stress during the peeling process of protective material (G) and protective film (F).

Furthermore, various preferred structures may be employed for how to pass each film through a thermocompression bonding device (may also be referred to as a pass line). For example, as shown in FIGS. 3 and 5, after rolled adhesive sheet (C) 3 is delivered from the roll, metal foil (D) 4, protective material (G) 7 and protective film (F) 6, if applicable, are laminated on adhesive sheet (C) 3, the lamination materials are thermally compressed by going through one or more pairs of metallic rolls 9, and then protective material (G) 7 and protective film (F) 6, if applicable, are peeled by going through one of more peel rolls 10. In such a procedure to obtain single-sided metal-clad laminate (F) 5, adhesive sheet (C) 3, compressed lamination materials and single-sided metal-clad laminate (E) 5 may be aligned in a straight line, or they may pass while meandering through various rolls including one or more metallic rolls 9 and one or more peel rolls 10 equipped with the thermocompression bonding device. Here, a straight line means adhesive sheet (C) 3, compressed lamination materials and single-sided metal-clad laminate (E) 5 move over a single plane without meandering. Adhesive sheet (C) 3, compressed lamination materials and single-sided metal-clad laminate (E) 5 may also move through part of the pass line in a straight line while meandering over the rest of the pass line.

Regarding the radius of paired peel rolls to peel the protective material (G) from the single-sided metal-clad laminate (E), radius (ra) of the peel roll on the protective material (G) side is preferred to be smaller than radius (rb) of the peel roll on the opposing single-sided metal-clad laminate (E) side (namely, on the metal foil (D) side or protective film (F) side).

Regarding the radius of paired peel rolls to peel protective film (F) from single-sided metal-clad laminate (E), radius (ra) of the peel roll on the protective film (F) side is preferred to be smaller than radius (rb) of the peel roll on the opposing single-sided metal-clad laminate (E) side (namely, on the adhesive sheet (C) side or protective material (G) side).

The smaller the radius (ra) of the peel roll on the to-be-peeled protective material (G) side, or on the to-be-peeled protective film (F) side, the smaller the curvature radius during the process of peeling protective material (G) or protective film (F). In other words, the curvature radius is closer to an acute curve, and the peel angle (angle at the moment of peeling), that is, the above ($\alpha$) or ($\beta$), is thereby made smaller than 90°.

In other words, radius (ra) of the peel roll on the to-be-peeled protective material (G) side, or on the to-be-peeled protective film (F) side, and radius (rb) of the peel roll on the opposing single-sided metal-clad laminate (E) side are preferred to have a radius ratio (ra/rb) of smaller than 1. By so setting, a single-sided metal-clad laminate (E) is obtained having no wrinkles or warping. The ratio (ra/rb) is more preferred to be smaller than 0.75, even more preferably smaller than 0.4.

The peeling speed of protective material (G) or protective film (F) from single-sided metal-clad laminate (E), namely a transport speed of a metal-clad laminate, is preferred to be 3.5 m/min or slower, more preferably 2 m/min. When the peeling speed is 3.5 m/min or slower, uniform results are maintained during the peeling process. It is preferred for the peeling speed to be 3.5 m/min or slower in order to maintain uniform results during the peeling process.

The method for heating the lamination materials in the above thermocompression bonding method is not limited particularly; for example, various conventionally known heating methods capable of heating at a predetermined temperature such as heat circulation, hot air blowing and induction heating may be used. In the same manner, the method for compressing the lamination materials in the above thermocompression bonding method is not limited particularly; for example, various conventionally known compression methods capable of exerting a predetermined pressure may be used, for example, a hydraulic method air pressure method and pressure on the gap method.

<Compression Bonding Temperatures>

The heating temperature in the above thermocompression bonding, namely, the compression bonding temperature (lamination temperature) (T1) (° C.) is preferred to be 20° C.~90° C. higher than the glass transition temperature (Tg) (T2) (° C.) of a thermoplastic resin layer (B) on an adhesive sheet (C) to be used, more preferably 50° C.~80° C. higher than the (Tg) of a thermoplastic resin layer (B) on the adhesive sheet (C). If (T1-T2) is in such a range, an excellent result is obtained when the adhesive sheet (C) and protective material (G) are peeled.

The lamination speed during the above thermocompression bonding step, namely, the transport speed of a metal-clad laminate, is preferred to be 0.5 m/min or faster, more preferably 1.0 m/min or faster. When the speed is 0.5 m/min or faster, sufficient thermocompression bonding is achieved, and when it is 1.0 m/min or faster, productivity is further enhanced.

The higher the pressure in the above thermocompression bonding, namely, the lamination pressure, the more advantageous it is to reduce the lamination temperature while setting a faster lamination speed. On the other hand, an overly high lamination pressure generally tends to worsen the dimensional change of the obtained single-sided metal-clad laminate (E), while an overly low lamination pressure tends to lower the adhesive strength of metal foil in the single-sided metal-clad laminate (E). Therefore, the lamination pressure is preferred to be in a range of 49 N/cm~490 N/cm (5 kgf/cm~50 kgf/cm), more preferably 98 N/cm~294 N/cm (10 kgf/cm~30 kgf/cm). Such a range enables three conditions, namely, the lamination temperature, lamination speed and lamination pressure, to be set as excellent, and productivity is further enhanced.

<Manufacturing Apparatus of Single-Sided Metal-Clad Laminate (E)>

To obtain a single-sided metal-clad laminate (E) by the method for manufacturing a single-sided metal-clad laminate (E) related to the present invention, it is preferred to use a hot-roll lamination apparatus capable of continuous thermocompression bonding while heating the laminated materials obtained by laminating a metal foil (D), protective film (F), protective material (G) and the like on the adhesive sheet (C). In the thermal lamination apparatus, a peeling section for peeling protective materials or the like is arranged on the downstream side of the thermal lamination section tor conducting thermal lamination so that the protective material (G) and protective film (F), if applicable, are peeled from the single-sided metal-clad laminate (E). In the hot-roll lamination apparatus, it is an option to arrange a feeding section for feeding the lamination materials on the upstream side of the thermal lamination section for conducting thermal lamination, and it is also an option to arrange a wind-up section for winding the lamination materials on the downstream side of the thermal lamination section. By arranging such sections, productivity is further enhanced in the hot-roll lamination apparatus. A specific structure of the section for feeding or winding lamination materials is not limited particularly; examples are a known roll-type wind-up device or the like capable of winding the adhesive sheet (C), metal foil (D) or the obtained single-sided metal-clad laminate (E).

In a preferred embodiment of the present invention, the apparatus for manufacturing a single-sided metal-clad laminate (E) includes the following sections as shown in FIG. 3; a thermal lamination section 9 to thermally laminate adhesive sheet (C) 3 having a thermoplastic resin layer (B) on both surfaces of heat-resistant film (A), metal foil (D) 4 disposed via a thermoplastic resin layer (B) on a surface of adhesive sheet (C) 3, and protective material (G) 7 disposed via a thermoplastic resin layer (B) on the side of adhesive sheet (C) having no metal foil (D) laminated thereon, and a protective-material peeling section located on the downstream side for peeling protective material (G) 7 from the single-sided metal-clad laminate (E) 5. The protective-material peeling section is structured so that an angle ($\alpha$), made by single-sided metal-clad laminate (E) prior to peeling protective material (G) and peeled protective material (G), is set to be greater than 0° but smaller than 90°. Having such a structure is preferable since the peel strength is lowered between the protective material (G) and single-sided metal-clad laminate (E), and the protective material (G) is thereby appropriately peeled from the single-sided metal-clad laminate (E). Moreover, warping is suppressed from occurring in the obtained single-sided metal-clad laminate In another preferred embodiment of the present invention, the apparatus for manufacturing a single-sided metal-clad laminate (E) includes the following sections as shown in FIG. 5; a thermal lamination section 9 for thermally laminating adhesive sheet (C) 3 having a thermoplastic resin layer (B) on both surfaces of heat-resistant film (A), metal foil (D) 4 disposed via a thermoplastic resin layer (B) on a surface of adhesive sheet (C) 3, protective film (F) 6 disposed to be in contact with metal foil (D) 4, and protective material (G) 7 disposed via a thermoplastic resin layer (B) on the side of adhesive sheet (C) 3 having no metal foil (D) 4 laminated thereon; and a protective-material peeling section to peel protective material (G) 7 from the single-sided metal-clad laminate (E) 5 and a protective-film peeling section to peel protective film (F) 6 from the single-sided metal-clad laminate (E) 5 located on the downstream side of the thermal lamination section. The protective-material peeling section is structured to have an angle ($\alpha$), made by the single-sided metal-clad laminate (E) prior to peeling protective material (G) 7 and the peeled protective material (G) 7, to be greater than 0° but smaller than 90° while the protective-film peeling section is structured so that an angle ($\beta$), made by the single-sided metal-clad laminate (E) prior to peeling protective film (F) and the peeled protective film (F), is set to be greater than 0° but smaller than 90°. Having such a structure is preferable since the peel strength is lowered when peeling the protective material (G) and protective film (F) from the single-sided metal-clad laminate (E), and the protective material (G) and protective film (F) are thereby appropriately peeled from the single-sided metal-clad laminate (E). Moreover, warping is suppressed from occurring in the obtained single-sided metal-clad laminate.

In an embodiment having a protective-material peeling section and a protective-film peeling section, the protective-film peeling section is preferred to be located on the downstream side of the protective-material peeling section.

In the manufacturing apparatus for a single-sided metal-clad laminate (E) related to the present invention, it is more preferred to have a heater for heating the adhesive sheet (C) arranged on the upstream side of the thermal lamination section.

Regarding the above-mentioned protective-material peeling section, or the above-mentioned protective-material peeling section and protective-film peeling section, it is more preferred to be structured so that the protective material (G), or the protective material (G) and protective film (F), re each peeled from the single-sided metal-clad laminate (E) by a pair of peel rolls. Compared with peeling them using, for example, a single peel roll, the single-sided metal-clad laminate (E) will not be pulled by the protective material (G) or protective film (F) when a pair of peel rolls is used thus achieving a stable peeling process. In addition, radius (ra) of a peel roll on the to-be-peeled protective material (G) side, or on the to-be-peeled protective film (F) side, and radius (rb) of a peel roll on the opposing single-sided metal-clad laminate (E) side are preferred to have a radius ratio (ra/rb) of smaller than 1 as described above.

The contents described in "Manufacturing Method for Single-sided Metal-clad Laminate (E)" may also apply to the structures of a manufacturing apparatus of a single-sided metal-clad laminate (E), thermal lamination section 9, protective-material peeling section and protective-film peeling section.

Moreover, in the apparatus for manufacturing a single-sided metal-clad laminate (E) related to the present invention, it is also preferable to arrange a wind-up section for winding the peeled protective material (G) and protective film (F) and a feeding section for feeding those lamination materials. When a wind-up section and a feeding section are arranged, the protective material (G) and protective film (F) used once in a thermocompression bonding step are wound up to be set again on the feeding side so that the protective material (G) and protective film (F) are recycled. In addition, when the protective material (G) and protective film (F) are wound up, an edge detection section and wind-up position collection section may be arranged so that both of their edges are aligned. By so setting, their edges are accurately aligned before being wound up, thereby enhancing the recycling efficiency. The wind-up section, feeding section, edge portion detection section and wind-up position correction section are not limited to have any specific structures, and various conventionally known devices may be employed.

As described, by controlling the linear expansion coefficient of the entire adhesive sheet (C), warping is suppressed from occurring in the obtained single-sided metal-clad laminate (E). More specifically, when a rectangular single-sided metal-clad laminate (E) of 7 cm wide×20 cm long is manufactured, warping in each of its four corners is preferred to be 1.0 mm or less after the laminate is left standing for 12 hours under conditions of 20° C. and 60% R.H. When warping in a single-sided metal-clad laminate (E) is within the above range, an FPC is suppressed from warping during transport through the production process and after being etched for the formation of circuits.

Namely, the present invention has the following aspects.

[1] A manufacturing method of a single-sided metal-clad laminate (E), characterized by using an adhesive sheet (C) having a thermoplastic resin layer (B) on both surfaces of a heat-resistant film (A), including a step for laminating a metal foil (D) via a thermoplastic resin layer (B) on a surface of the adhesive sheet (C), and a step for laminating a protective material (G) via a thermoplastic resin layer (B) on the side of adhesive sheet (C) having no metal foil (D) laminated thereon, further including a step for peeling the protective material (G); in the method, an angle (α), made by the single-sided metal-clad laminate (E) prior to peeling the protective material (G) and the peeled protective material (G), is set greater than 0° but smaller than 90°.

[2] The manufacturing method of a single-sided metal-clad laminate (E) according to [1], characterized by using an adhesive sheet (C) having a thermoplastic resin layer (B) on both surfaces of a heat-resistant film (A), including a step for laminating a metal foil (D) via a thermoplastic resin layer (B) on a surface of the adhesive sheet (C), and further laminating a protective film (F) to be in contact with the metal foil (D), and a step for laminating a protective material (G) via a thermoplastic resin layer (B) on the surface of adhesive sheet (C) having no metal foil (D) laminated thereon, further including a step for peeling the protective material (G) and protective film (F); in the method, an angle (α), made by the single-sided metal-clad laminate (E) prior to peeling the protective material (G) and the peeled protective material (G), is set greater than 0° but smaller than 90°, and an angle (β), made by the single-sided metal-clad laminate (E) prior to peeling the protective film (F) and the peeled protective film (F), is set greater than 0° but smaller than 90°.

[3] The manufacturing method of a single-sided metal-clad laminate (E) according to [2], in which the protective material (G) and the protective film (F) are peeled in that order when the protective material (G) and protective film (F) are peeled from the single-sided metal-clad laminate (E).

[4] The manufacturing method of a single-sided metal-clad laminate (E) according to any of [1]~[3], in which a thermocompression bonding method is employed.

[5] The manufacturing method of a single-sided metal-clad laminate (E) according to [4], in which the thermocompression bonding method uses a thermal lamination apparatus equipped with one or more paired metallic rolls.

[6] the manufacturing method of a single-sided metal-clad laminate (E) according to [4] or [5], in which compression bonding temperature (T1) for thermocompression bonding is set 20~90° C. higher than the glass transition temperature (T2) of a thermoplastic resin layer (B) of the adhesive sheet (C).

[7] The manufacturing method of a single-sided metal-clad laminate (E) according to any of [4]~[6], in which prior to thermocompression bonding, the adhesive sheet is heated at a temperature of 250°~550° C.

[8] The manufacturing method of a single-sided metal-clad laminate (E) according to any of [1]~[7], in which when the linear expansion coefficient of the adhesive sheet (C) is set as (X1) and the linear expansion coefficient of the protective material (G) is set as (X2), a protective material (G) having |X1−X2|≥3 ppm/° C. is used.

[9] The manufacturing method of a single-sided metal-clad laminate (E) according to any of [1]~[8], using a protective material (G) having a surface roughness of 0.01 μm~3 μm.

[10] The manufacturing method of a single-sided metal-clad laminate (E) according to any of [1]~[9], in which the heat-resistant film (A) is a non-thermoplastic polyimide film.

[11] The manufacturing method of a single-sided metal-clad laminate (E) according to any of [1]~[10], in which a thermoplastic resin layer (B) contains a thermoplastic polyimide resin.

[12] The manufacturing method of a single-sided metal-clad laminate (E) according to any of [1]~[11], in which the speed of peeling the protective material (G), or the protective material (G) and protective film (F), from the single-sided metal-clad laminate (E) is 3.5 m/min or slower.

[13] The manufacturing method of a single-sided metal-clad laminate (E) according to any of [1]~[12], in which the protective material (G), or the protective material (G) and protective film (F), are each peeled from the single-sided metal-clad laminate (E) by a pair of peel rolls, and radius (ra) of the peel roll on the to-be-peeled protective material (G) side, or on the to-be-peeled protective film (F) side, and radius (rb) of the peel roll on the opposing single-sided metal-clad laminate (E) side are set to have a radius ratio (ra/rb) of smaller than 1.

[14] A manufacturing apparatus of a single-sided metal-clad laminate (E), characterized by including a thermal lamination section to thermally laminate an adhesive sheet (C) having a thermoplastic resin layer (B) on both surfaces of a heat-resistant film (A), a metal foil (D) disposed via a thermoplastic resin layer (B) on a surface of the adhesive sheet, and a protective material (G) disposed via a thermoplastic resin layer (B) on the side of adhesive sheet (C) having no metal foil (D) laminated thereon; and a protective-material peeling section located on the downstream side to peel the protective material (G) from the single-sided metal-clad laminate (E); in such a manufacturing apparatus, the protective-material peeling section is structured so that an angle (α), made by the single-sided metal-clad laminate (E) prior to peeling the protective material (G) and the peeled protective material (G), is set to be greater than 0° but smaller than 90°.

[15] The manufacturing apparatus of a single-sided metal-clad laminate (E) according to [14], characterized by including a thermal lamination section to thermally laminate an adhesive sheet (C) having a thermoplastic resin layer (B) on both surfaces of a heat-resistant film (A), a metal foil (D) disposed via a thermoplastic resin layer (B) on a surface of the adhesive sheet (C), a protective film (F) disposed to be in contact with the metal foil (D), and a protective material (G) disposed via a thermoplastic resin layer (B) on the side of adhesive sheet (C) having no metal foil (D) laminated thereon; a protective-material peeling section to peel the protective material (G) from the single-sided metal-clad laminate (E) and a protective-film peeling section to peel the protective film (F) from the single-sided metal-clad laminate (E) located on the downstream side of the thermal lamination section; in such a manufacturing apparatus, the protective-material peeling section is structured so that an angle (α), made by the single-sided metal-clad laminate (E) prior to peeling the protective material (G) and the peeled protective material (G), is set to be greater than 0° but smaller than 90°, while the protective-film peeling section is structured so that an angle (β), made by the single-sided metal-clad laminate (E) prior to peeling the protective film (F) and the peeled protective film (F), is set to be greater than 0° but smaller than 90°.

[16] The manufacturing apparatus of a single-sided metal-clad laminate (E) according to [15], in which the protective-film peeling section is arranged on the downstream side of the protective-material peeling section.

[17] The manufacturing apparatus of a single-sided metal-clad laminate (E) according to any of [14]~[16], in which a heater for heating the adhesive sheet (C) is arranged on the upstream side of the thermal lamination section.

[18] The manufacturing apparatus of a single-sided metal-clad laminate (E) according to any of [14]~[17], in which the heat-resistant film (A) is a non-thermoplastic polyimide film.

[19] The manufacturing apparatus of a single-sided metal-clad laminate (E) according to any of [14]~[18], in which a thermoplastic resin layer (B) contains a thermoplastic polyimide resin.

[20] The manufacturing apparatus of a single-sided metal-clad laminate (E) according to any of [14]~[19], in which the protective-material peeling section, or the protective-material peeling section and protective-film peeling section, are each structured to peel the protective material (G), or the protective material (G) and protective film (F), from the single-sided metal-clad laminate (E) by a pair of peel rolls, and radius (ra) of the peel roll on the to-be-peeled protective material (G) side, or on the to-be-peeled protective film (F) side, and radius (rb) of the peel roll on the opposing single-sided metal-clad laminate (E) side are set to have a radius ratio (ra/rb) of smaller than 1.

EXAMPLES

The manufacturing method for single-sided metal-clad laminate (E) is described below in detail by referring to examples. However, the present invention is not limited to those examples.
(Measuring Linear Expansion Coefficient of Film)

Using TMA120C made by Seiko Instruments Inc. (sample size: 3 mm wide, 10 mm long) after the temperature was raised from 10° C. to 400° C. at a rate of 10° C./min under a load of 3 grams, the temperature was lowered to 10° C., and then raised at a rate of 10° C./min. The thermal expansion coefficient was determined to be the average value of thermal expansion coefficients measured when the temperature was raised a second time from 100° C. to 200° C.
(Measuring Surface Roughness (Rz) of Film)

Using VK-X200 made by Keyence, the surface roughness (Rz) of a film was measured in accordance with JIS B0601 1994.

(Measuring Peel Strength)

Test pieces were prepared from a single-sided metal-clad laminate (A) and a single-sided metal-clad laminate (B) formed for evaluation of peel strength in the examples and comparative examples, which were cut into 10 mm×100 mm rectangles.

Figure 10:
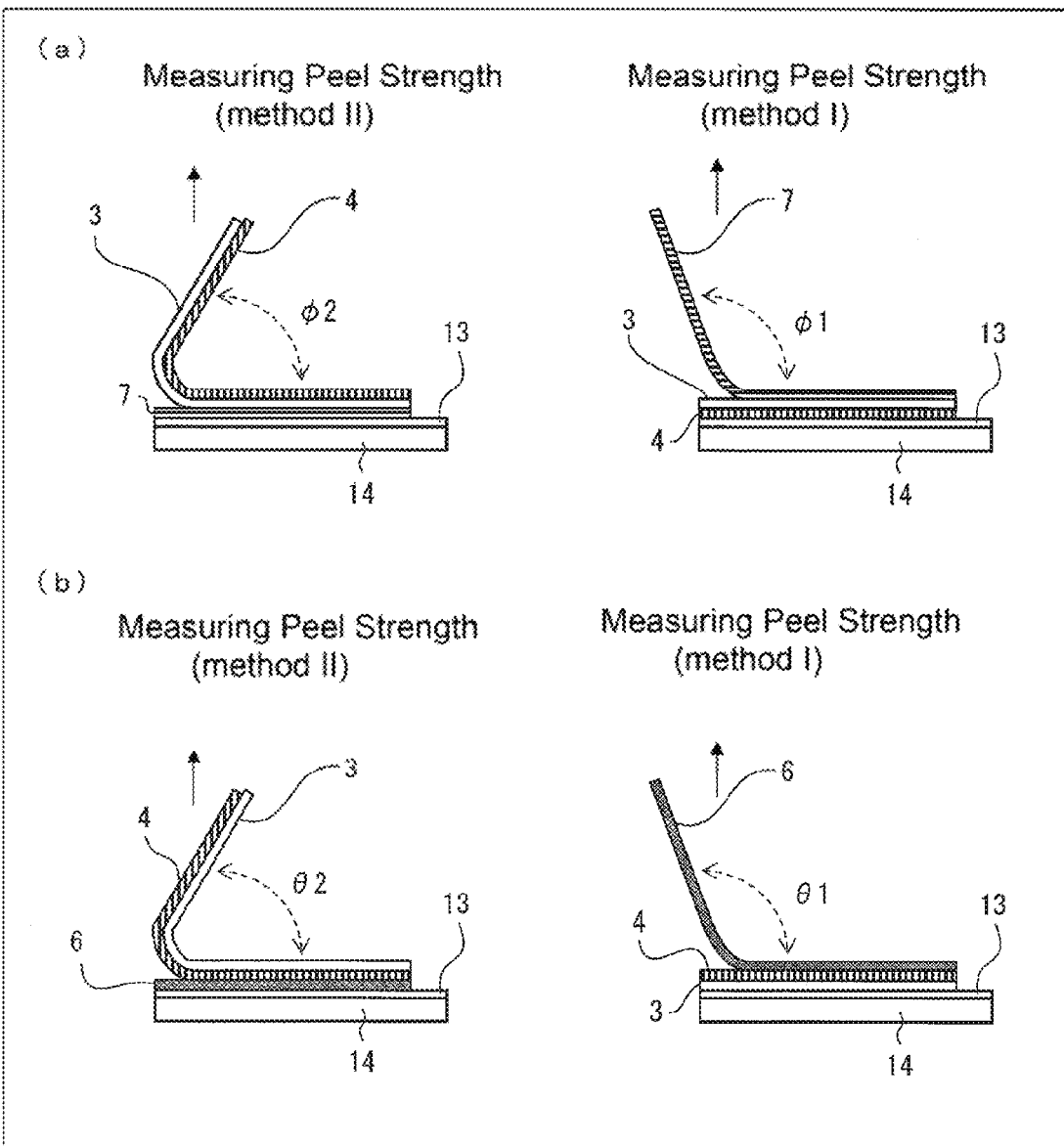
FIG. 10 is a view illustrating methods for measuring the peel strength of a single-sided metal-clad laminate (E)

As shown in FIG. 10(a) and FIG. 10(b), double-sided tape G9052 made by Sony Chemicals Corporation was laminated to a side of a test piece opposite the side to be pulled (double-sided tape 13 in the drawings), and the test piece was laminated on substrate 14 via double-sided tape 13. Peel angles (φ1, φ2) and (θ1, θ2) were set as specified in Table 1, and the test piece was peeled at a rate of 50 mm/min in accordance with "8.1 Peel Strength" in JIS C6471.

During that time, as shown in FIG. 10(a), the following methods were employed: measuring peel strength (method II) by setting a peel angle (φ2) for peeling a laminate of heat-resistant double-sided adhesive sheet 3 and copper foil 4 from a single-sided metal-clad laminate (A) prepared for peel strength evaluation; and measuring peel strength (method I) by setting a peel angle (φ1) for peeling protective material 7 from a single-sided metal-clad laminate (A) prepared for peel strength evaluation.

Also, as shown in FIG. 10(b), following methods were employed: measuring peel strength (method II) by setting a peel angle (φ2) for peeling a laminate of heat-resistant double-sided adhesive sheet 3 and copper foil 4 from a single-sided metal-clad laminate (B) prepared for peel strength evaluation; and measuring peel strength (method I) by setting a peel angle (θ1) for peeling protective film 6 from a single-sided metal-clad laminate (B) prepared for peel strength evaluation.

Figure 11:
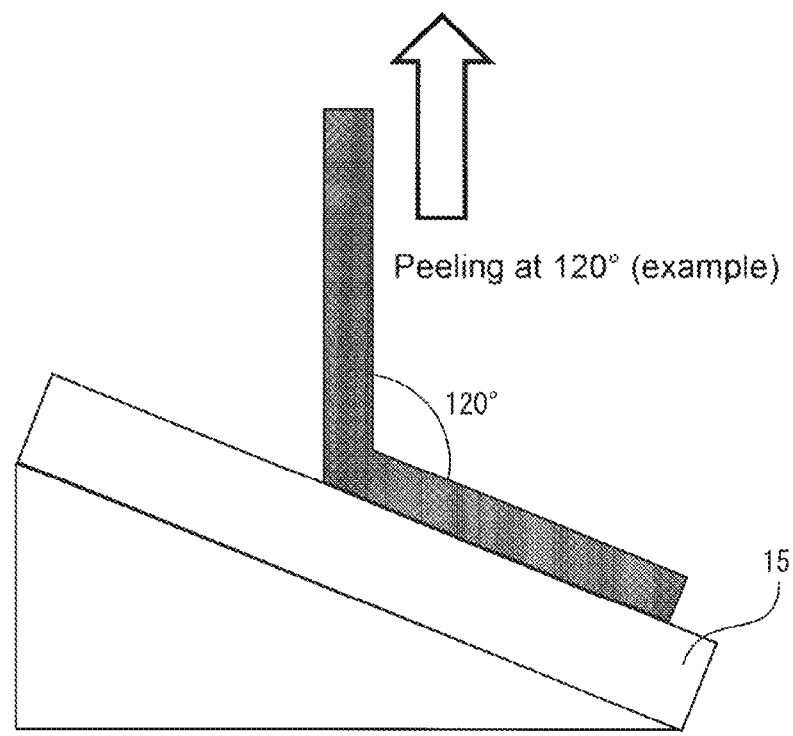
FIG. 11 is a view illustrating a method for measuring the peel strength of a single-sided metal-clad laminate (E)

Although JIS C6471 describes peeling in a direction of 90° and peeling in a direction of 180°, peel angles were specified as shown in Table 1 to measure peel strength in the above measurements. More specifically, as shown in FIG. 11, stand 15 was arranged at an angle so that when a test piece was set on stand 15 and pulled upward, each peel angle was set as specified in Table 1. Stand 15 is made slidable so that when a test piece is pulled upward, a constant peel angle is maintained. FIG. 11 shows an example where the peel angle is set at 120°.
(Evaluation of Peelability of Protective Material)

The peelability of protective materials was observed and evaluated as follows. ⊚: the thermoplastic polyimide layer shows the same condition as that prior to the peeling process after the protective material is peeled; ○: the protective material is peelable and the post-peeling thermoplastic polyimide layer has no problem being used although its luster is reduced from that prior to thermal lamination; Δ: the protective material is peelable and the post-peeling thermoplastic polyimide layer has no problem being used despite bearing partially observed microscopic scratches, and x: the protective material is hard to peel and even if it is peeled, the post-peeling thermoplastic polyimide layer is entirely wavy.
(Evaluation of Peelability of Protective Film)

The peelability of protective films was observed and evaluated under the same criteria employed for evaluating the peelability of protective materials.
(Evaluation of Warping in Single-Sided Metal-Clad Laminate (E))

From a prepared single-sided metal-clad laminate (E), a test piece for evaluation was cut out to have a size of 7 cm wide×20 cm long. The test piece was left standing for 12 hours under conditions of 20° C. and 60% R.H., and warping of the four corners of the test piece was measured. The result was evaluated as follows: ⊚: no warping observed, with each of the four corners showing warping of 1.0 mm or less; ○: warping of 3.0 mm or less at each of the four corners; Δ: warping of 5.0 mm or less at each of the four corners; and x: warping clearly observed, with at least one corner showing warping of 5.0 mm or more.

Example 1

On a heat-resistant double-sided adhesive sheet with a linear expansion coefficient of 20 ppm/° C. and (Tg) of thermoplastic resin layers of 290° C. (Pixio FRS, 255 mm wide, made by Kaneka Corporation), a 12 μm-thick rolled cooper foil (GHY5-82F-HA, 270 mm wide, made by JX Nippon Mining & Metals Corporation) was laminated as the metal foil, and a protective film (Apical® 125NPI, made by Kaneka Corporation) was further disposed to sandwich the metal foil with the adhesive sheet. On the other side of the adhesive sheet, a polyimide film with a linear expansion coefficient of 16 ppm/° C. and Rz=2.2 μm (Apical® 75 NPI, made by Kaneka Corporation) was disposed as the protective material. The entire lamination material was passed through a pair of metallic rolls in a hot-roll lamination apparatus for thermal lamination under conditions set to have a lamination temperature of 360° C., lamination pressure of 245 N/cm and lamination speed (transport speed of a metal-clad laminate ) of 1 m/min. Prior to thermal lamination, the adhesive sheet was heated from the protective-material side by a heater at a temperature of 300° C. The length of the heater was 300 mm, and the heating time was 0.3 minutes. Then, using the method shown in FIG. 5, the protective material and protective film were peeled in that order by passing the laminate through paired peel rolls each having a radius ratio (ra/rb) of two peel rolls set at 0.32 (40 mm/125 mm). Accordingly, a single-sided metal-clad laminate (E) was obtained. In the peeling steps, (α) was 55°, and (β) was 30°.

The peelability of protective material and of protective film, as well as warping in the single-sided metal-clad laminate (E), was evaluated. The results are shown in Table 1.

In the manufacturing process of a single-sided metal-clad laminate (E), the thermoplastic resin of the adhesive sheet did not stick to transport rolls or the like, and no warping occurred in the single-sided metal-clad laminate (E).

Next, by peeling the protective film without peeling the protective material, a single-sided metal-clad laminate (A) was prepared for evaluating the peel strength of a laminate having a structure of the protective material, heat-resistant double-sided adhesive sheet and copper foil. Moreover, by peeling the protective material without peeling the protective film a single-sided metal-clad laminate (B) was prepared for evaluating the peel strength of a laminate having a structure of a heat-resistant double-sided adhesive sheet, copper foil and protective film. Using the single-sided metal-clad laminate (A) and single-sided metal-clad laminate (B), the peel strength of each laminate was measured. The results are shown in Table 1.

Example 2

A single-sided metal-clad laminate (E) was manufactured the same as in Example 1 except that a polyimide film with a linear expansion coefficient of 12 ppm/° C. and Rz=0.3 μm (Upilex® 25S, made by Ube Industries, Ltd.) was used as the protective material.

The peelability of protective material and of protective film, and warping in the single-sided metal-clad laminate (E) were evaluated. In addition, using a single-sided metal-clad laminate (A) and a single-sided metal-clad laminate (B), the peel strength of each was measured. The results are shown in Table 1.

In the manufacturing process of a single-sided metal-clad laminate (E), the thermoplastic resin of the adhesive sheet did not stick to transport rolls or the like, and no warping occurred in the obtained single-sided metal-clad laminate (E).

Example 3

A single-sided metal-clad laminate (E) was manufactured the same as in Example 1 except that a polyimide film with a linear expansion coefficient of 32 ppm/° C. and Rz=2.1 μm (Apical® 12.5 AH, made by Kaneka Corporation) was used as the protective material.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 1.

In the manufacturing process of a single-sided metal-clad laminate (E), the thermoplastic resin of the adhesive sheet did not stick to transport rolls or the like, and no warping occurred in the obtained single-sided metal-clad laminate (E).

Example 4

A single-sided metal-clad laminate (E) was manufactured the same as in Example 1 except that a 12 μm-thick electrolytic copper foil (3EC-M3S-HTE, made by Mitsui Mining & Smelting Co., Ltd.) was used as the metal foil.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 1.

In the manufacturing process of a single-sided metal-clad laminate (E), the thermoplastic resin of the adhesive sheet did not stick to transport rolls or the like, and no warping occurred in the obtained single-sided metal-clad laminate (E).

Example 5

A single-sided metal-clad laminate (E) was manufactured the same as in Example 1 except that the protective material and protective film were each peeled using a pair of peel rolls with a radius ratio (ra/rb) of two peel rolls set to be 0.5 (50 mm/100 mm).

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 1.

In the manufacturing process of a single-sided metal-clad laminate (E), the thermoplastic resin of the adhesive sheet did not stick to transport rolls or the like, and no warping occurred in the obtained single-sided metal-clad laminate (E).

Example 6

A single-sided metal-clad laminate (E) was manufactured the same as in Example 1 except that thermal lamination was conducted by setting the lamination speed (transport speed of a metal-clad laminate) at 3 m/min.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 1.

In the manufacturing process of a single-sided metal-clad laminate (E), the thermoplastic resin of the adhesive sheet did not stick to transport rolls or the like, and warping was hardly observed in the obtained single-sided metal-clad laminate (E).

Example 7

A single-sided metal-clad laminate (E) was manufactured the same as in Example 1 except that (α) was set at 85° C. in a step for peeling the protective material.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 1.

In the manufacturing process of a single-sided metal-clad laminate (E), the thermoplastic resin of the adhesive sheet did not stick to transport rolls or the like, and no warping occurred in the obtained single-sided metal-clad laminate (E).

Example 8

A single-sided metal-clad laminate (E) was manufactured the same as in Example 1 except that prior to thermal lamination, the adhesive sheet was heated from the protective-material side by a heater with a temperature of 500° C.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 1.

In the manufacturing process of a single-sided metal-clad laminate (E), the thermoplastic resin of the adhesive sheet did not stick to transport rolls or the like, and no warping occurred in the obtained single-sided metal-clad laminate (E).

Example 9

A single-sided metal-clad laminate (E) was manufactured the same as in Example 1 except that a polyimide film with a linear expansion coefficient of 20 ppm/° C. and Rz=0.5 μm (Upilex® 50S, made by Ube Industries, Ltd.) was used as the protective material.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in table 2.

In the manufacturing process of a single-sided metal-clad laminate (E), the thermoplastic resin of the adhesive sheet did not stick to transport rolls or the like. Although slight warping occurred in the obtained single-sided metal-clad laminate (E), it was at an allowable level. The adhesive sheet (single-sided metal-clad laminate) and the protective material showed a greater adhesiveness than that in Example 1; they were hard to peel from each other, but were within a peelable range.

Example 10

A single-sided metal-clad laminate (E) was manufactured the same as in Example 1 except that the protective material and protective film were each peeled using a pair of peel rolls with a radius ratio (ra/rb) of two peel rolls set to be 1 (100 mm/100 mm).

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 2.

In the manufacturing process of a single-sided metal-clad laminate (E), the thermoplastic resin of the adhesive sheet did not stick to transport rolls or the like. Although slight warping occurred in the obtained single-sided metal-clad laminate (E), it was at an allowable level. The peelability of protective material and of protective film was lower than in Example 1 but was within a peelable range.

Example 11

A single-sided metal-clad laminate (E) was manufactured the same as in Example 1 except that thermal lamination was conducted by setting the lamination speed (transport speed of a metal-clad laminate) at 4 m/min.

The peelability of protective material and of protective film, and warping in the single-sided metal-clad laminate (E) were-evaluated. In addition, using a single-sided metal-clad laminate (A) and a single-sided metal-clad laminate (B), the peel strength of each laminate was measured. The results are shown in Table 2.

In the manufacturing process of a single-sided metal-clad laminate (E), the thermoplastic resin of the adhesive sheet did not stick to transport rolls or the like. Although slight warping occurred in the obtained single-sided metal-clad laminate (E), it was at an allowable level. The peelability of protective material and of protective film was lower than in Example 1 but was within a peelable range.

Example 12

A single-sided metal-clad laminate (E) was manufactured the same as in Example 1 except that a polyimide film with a linear expansion coefficient of 20 ppm/° C. and Rz=3.5 μm (sand blasted polyimide film, Apical®, made by Kaneka Corporation) was used as the protective material.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 2.

In the manufacturing process of a single-sided metal-clad laminate (E), the thermoplastic resin of the adhesive sheet did not stick to transport rolls or the like. Although slight warping occurred in the obtained single-sided metal-clad laminate (E), it was at an allowable level. The peelability of protective material and of protective film was lower than in Example 1 but was within a peelable range.

Example 13

A single-sided metal-clad laminate (E) was manufactured the same as in Example 1 except that the adhesive sheet was not heated prior to thermal lamination.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 2.

In the manufacturing process of a single-sided metal-clad laminate (E), the thermoplastic resin of the adhesive sheet did not stick to transport rolls or the like, and no warping occurred in the obtained single-sided metal-clad laminate (E). The peelability of the protective material was slightly lower than in Example 1 but was within a peelable range.

Comparative Example 1

Figure 6:
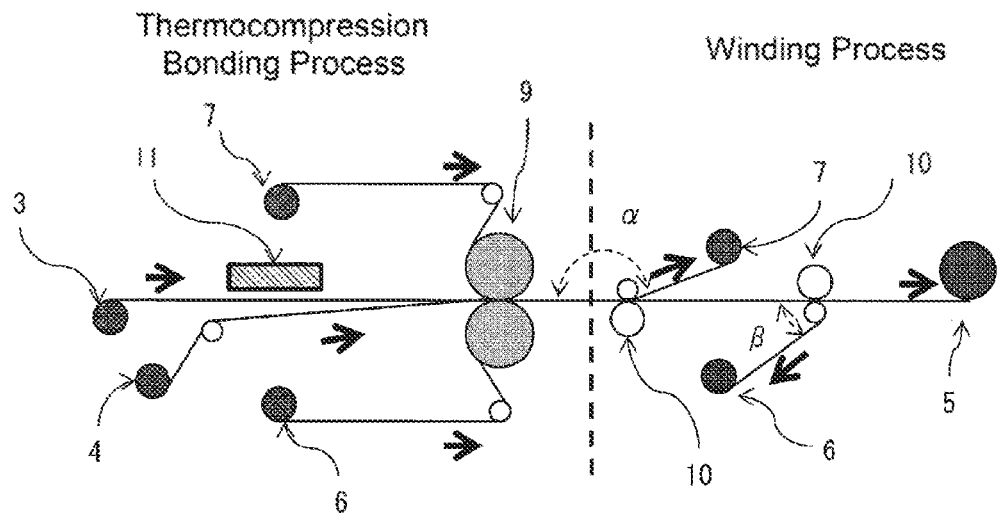
FIG. 6 is a cross-sectional view schematically showing an example of the method (apparatus) for manufacturing a single-sided metal-clad laminate (E) as a comparative example of the present invention.

A single-sided metal-clad laminate (E) was manufactured the same as in Example 1 except that the angle ($\alpha$) made by the protective material (G) prior to being peeled and a single-sided metal-clad laminate (E) was set at 165° as shown in FIG. 6.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in Table 2.

As a result, no sticking on transport rolls or the like occurred, but the adhesive sheet and protective material showed a greater adhesiveness than in Example 1 and were harder to peel. Moreover, warping occurred in the obtained single-sided metal-clad laminate (E).

Comparative Example 2

Figure 7:
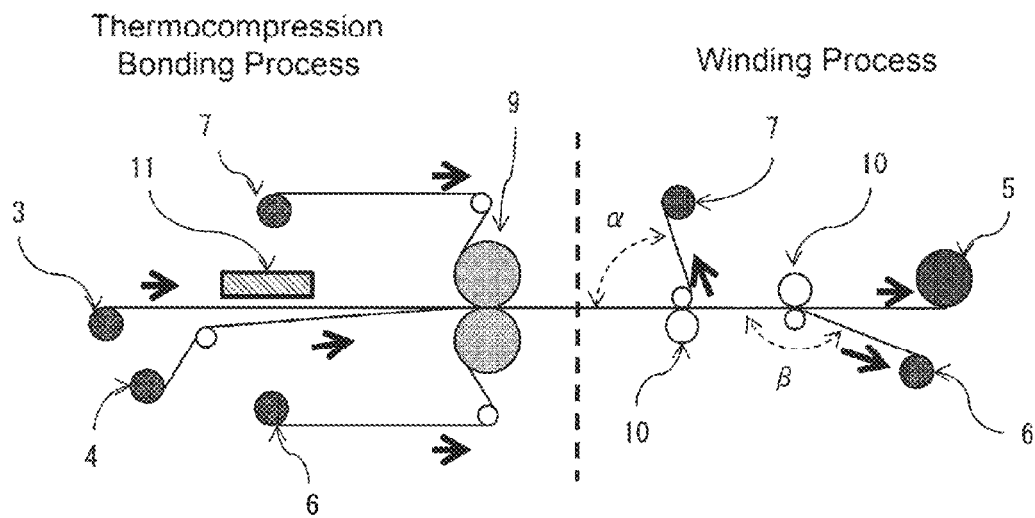
FIG. 7 is a cross-sectional view schematically showing an example of the method (apparatus) for manufacturing a single-sided metal-clad laminate (E) as a comparative example of the present invention.
Figure 8:
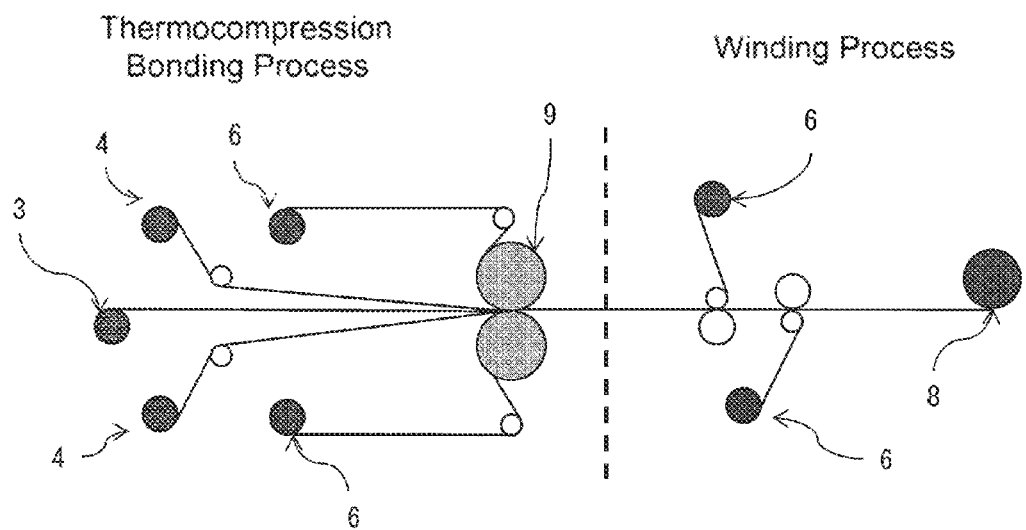
FIG. 8 is a cross-sectional view schematically showing an example of a conventional method (apparatus) for manufacturing a double-sided metal-clad laminate.

A single-sided metal-clad laminate (E) was manufactured the same as in Example 1 except that the angle ($\beta$) made by the protective film (F) prior to being peeled and a single-sided metal-clad laminate (E) was set at 165° as shown in FIG. 7.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown in table 2.

As a result, no sticking on transport rolls or the like occurred, but the copper foil (single-sided metal-clad laminate (E)) and the protective film showed a greater adhesiveness than in Example 1 and were harder to peel. Moreover, warping occurred in the obtained single-sided metal-clad laminate (E).

Comparative Example 3

A single-sided metal-clad laminate (E) was manufactured the same as in Example 1 except that the angle ($\alpha$) for peeling the protective material was set at 90° while the angle ($\beta$) for peeling the protective film was set 90°, and only one peel roll 12 each was used on the protective-material side and on the protective-film side.

The peelability of protective material and of protective film, and warping in the single-sided metal-clad laminate (E) were evaluated. In addition, using a single-sided metal-clad laminate (A) and a single-sided metal-clad laminate (B), the peel strength of each laminate was measured. The results are shown is Table 2.

As a result, no sticking on transport rolls or the like occurred, but the adhesiveness between the adhesive sheet single-sided metal-clad laminate (E)) and protective material, as well as the adhesiveness between copper foil (single-sided metal-clad laminate (E)) and protective film, was greater than in Example 1, and they were harder to peel. Moreover, warping occurred in the obtained single-sided metal-clad laminate (E).

TABLE 1

| | | Example 1 | Example 2 | Example 3 | Example 4 |
|---|---|---|---|---|---|
| | Roll pass line | FIG. 5 | FIG. 5 | FIG. 5 | FIG. 5 |
| | Type of copper foil | rolled copper foil | rolled copper foil | rolled copper foil | electrolytic copper foil |
| | Transport speed of metal-clad laminate (m/min) | 1 | 1 | 1 | 1 |
| | Radius ratio of paired peel rolls (ra/rb) | 0.32 | 0.32 | 0.32 | 0.32 |
| | Heater (temperature) (° C.) | 300 | 300 | 300 | 300 |
| Protective material | Protective material | Apical 75NPI | Upilex 2SS | Apical 12.5AM | Apical 75NPI |
| | Thickness (μm) | 75 | 25 | 12.5 | 75 |
| | Linear expansion coefficient X2 (ppm/° C.) | 16 | 12 | 32 | 16 |
| | X1-X2 (ppm/° C.) | 4 | 8 | 12 | 4 |
| | Rz (μm) | 2.2 | 0.3 | 2.1 | 2.2 |
| | $\alpha$ (°) | 55 | 55 | 55 | 55 |
| | Peel angle $\varphi 1$ (°) (method I) | 55 | 55 | 55 | 55 |
| | Peel angle $\varphi 2$ (°) (method II) | 125 | 125 | 125 | 125 |
| | Peel strength (N/cm) (method I) | 0.15 | 0.05 | 0.10 | 0.15 |
| | Peel strength (N/cm) (method II) | 0.10 | 0.02 | 0.05 | 0.10 |
| Protective film | Protective film | Apical 125NPI | Apical 125NPI | Apical 125NPI | Apical 125NPI |
| | Thickness (μm) | 125 | 125 | 125 | 125 |
| | $\beta$ (°) | 30 | 30 | 30 | 30 |
| | Peel angle $\theta 1$ (°) (method I) | 30 | 30 | 30 | 30 |
| | Peel angle $\theta 2$ (°) (method II) | 150 | 150 | 150 | 150 |
| | Peel strength (N/cm) (method I) | 0.12 | 0.12 | 0.12 | 0.08 |
| | Peel strength (N/cm) (method II) | 0.1 | 0.1 | 0.1 | 0.06 |
| | Peelability of protective material | ◉ | ◉ | ◉ | ◉ |
| | Peelability of protective film | ◉ | ◉ | ◉ | ◉ |
| | Warping in obtained single-sided metal-clad laminate | ◉ | ◉ | ◉ | ◉ |

TABLE 1-continued

|  |  | Example 5 | Example 6 | Example 7 | Example 8 |
|---|---|---|---|---|---|
|  | Roll pass line | FIG. 5 | FIG. 5 | FIG. 5 | FIG. 5 |
|  | Type of copper foil | rolled copper foil | rolled copper foil | rolled copper foil | rolled copper foil |
|  | Transport speed of metal-clad laminate (m/min) | 1 | 3 | 1 | 1 |
|  | Radius ratio of paired peel rolls (ra/rb) | 0.5 | 0.32 | 0.32 | 0.32 |
|  | Heater (temperature) (° C.) | 300 | 300 | 300 | 500 |
| Protective material | Protective material | Apical 75NPI | Apical 75NPI | Apical 75NPI | Apical 75NPI |
|  | Thickness (μm) | 75 | 75 | 75 | 75 |
|  | Linear expansion coefficient X2 (ppm/° C.) | 16 | 16 | 16 | 16 |
|  | X1-X2 (ppm/° C.) | 4 | 4 | 4 | 4 |
|  | Rz (μm) | 2.2 | 2.2 | 2.2 | 2.2 |
|  | α (°) | 55 | 55 | 85 | 55 |
|  | Peel angle φ1 (°) (method I) | 55 | 55 | 85 | 55 |
|  | Peel angle φ2 (°) (method II) | 125 | 125 | 85 | 125 |
|  | Peel strength (N/cm) (method I) | 0.15 | 0.15 | 0.2 | 0.14 |
|  | Peel strength (N/cm) (method II) | 0.10 | 0.10 | 0.12 | 0.10 |
| Protective film | Protective film | Apical 125NPI | Apical 125NPI | Apical 125NPI | Apical 125NPI |
|  | Thickness (μm) | 125 | 125 | 125 | 125 |
|  | β (°) | 30 | 30 | 30 | 30 |
|  | Peel angle θ1 (°) (method I) | 30 | 30 | 30 | 30 |
|  | Peel angle θ2 (°) (method II) | 150 | 150 | 150 | 150 |
|  | Peel strength (N/cm) (method I) | 0.12 | 0.12 | 0.12 | 0.12 |
|  | Peel strength (N/cm) (method II) | 0.1 | 0.1 | 0.1 | 0.1 |
|  | Peelability of protective material | ⊚ | ○ | ⊚ | ⊚ |
|  | Peelability of protective film | ⊚ | ○ | ⊚ | ⊚ |
|  | Warping in obtained single-sided metal-clad laminate | ⊚ | ○ | ⊚ | ⊚ |

TABLE 2

|  |  | Example 9 | Example 10 | Example 11 | Example 12 |
|---|---|---|---|---|---|
|  | Roll pass line | FIG. 5 | FIG. 5 | FIG. 5 | FIG. 5 |
|  | Type of copper foil | rolled copper foil | rolled copper foil | rolled copper foil | rolled copper foil |
|  | Transport speed of metal-clad laminate (m/min) | 1 | 1 | 4 | 1 |
|  | Radius ratio of paired peel rolls (ra/rb) | 0.32 | 1 | 0.32 | 0.32 |
|  | Heater (temperature) (° C.) | 300 | 300 | 300 | 300 |
| Protective material | Protective material | Upilex 50S | Apical 75NPI | Apical 75NPI | Apical 75NPI |
|  | Thickness (μm) | 50 | 75 | 75 | 75 |
|  | Linear expansion coefficient X2 (ppm/° C.) | 20 | 16 | 16 | 16 |
|  | X1-X2 (ppm/° C.) | 0 | 4 | 4 | 4 |
|  | Rz (μm) | 0.5 | 2.2 | 2.2 | 3.5 |
|  | α (°) | 55 | 55 | 55 | 55 |
|  | Peel angle φ1 (°) (method I) | 55 | 55 | 55 | 55 |
|  | Peel angle φ2 (°) (method II) | 125 | 125 | 125 | 125 |
|  | Peel strength (N/cm) (method I) | 0.4 | 0.15 | 0.15 | 1.2 |
|  | Peel strength (N/cm) (method II) | 0.35 | 0.10 | 0.10 | 1 |
| Protective film | Protective film | Apical 125NPI | Apical 125NPI | Apical 125NPI | Apical 125NPI |
|  | Thickness (μm) | 125 | 125 | 125 | 125 |
|  | β (°) | 30 | 30 | 30 | 30 |
|  | Peel angle θ1 (°) (method I) | 30 | 30 | 30 | 30 |
|  | Peel angle θ2 (°) (method II) | 150 | 150 | 150 | 150 |
|  | Peel strength (N/cm) (method I) | 0.12 | 0.12 | 0.12 | 1.5 |
|  | Peel strength (N/cm) (method II) | 0.1 | 0.1 | 0.1 | 1.2 |
|  | Peelability of protective material | Δ | ○ | Δ | Δ |
|  | Peelability of protective film | ⊚ | ○ | Δ | Δ |
|  | Warping in obtained single-sided metal-clad laminate | Δ | Δ | Δ | Δ |

Figure 9:
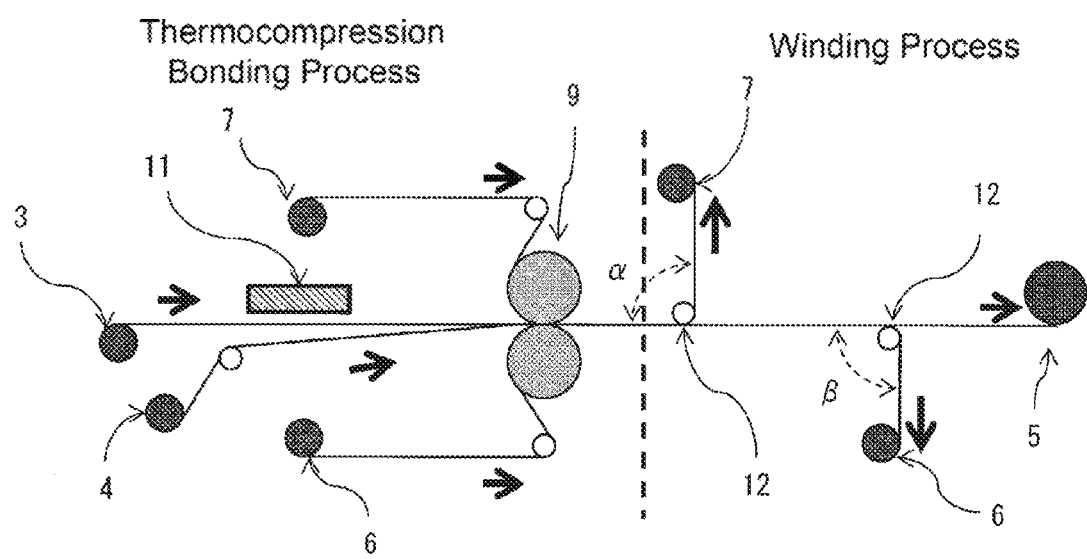
FIG. 9 is a cross-sectional view schematically showing an example of the method (apparatus) used in the present invention for manufacturing a single-sided metal-clad laminate (E)

|  |  | Example 13 | Comp. Example 1 | Comp. Example 2 | Comp. Example 3 |
|---|---|---|---|---|---|
|  | Roll pass line | FIG. 5 | FIG. 6 | FIG. 7 | FIG. 9 |
|  | Type of copper foil | rolled copper foil | rolled copper foil | rolled copper foil | rolled copper foil |
|  | Transport speed of metal-clad laminate (m/min) | 1 | 1 | 1 | 1 |
|  | Radius ratio of paired peel rolls (ra/rb) | 0.32 | 0.32 | 0.32 | — |
|  | Heater (temperature) (° C.) | none | 300 | 300 | 300 |
| Protective material | Protective material | Apical 75NPI | Apical 75NPI | Apical 75NPI | Apical 75NPI |
|  | Thickness (μm) | 75 | 75 | 75 | 75 |
|  | Linear expansion coefficient X2 (ppm/° C.) | 16 | 16 | 16 | 16 |
|  | X1-X2 (ppm/° C.) | 4 | 4 | 4 | 4 |
|  | Rz (μm) | 2.2 | 2.2 | 2.2 | 2.2 |
|  | α (°) | 55 | 165 | 55 | 90 |

TABLE 2-continued

|  |  |  |  |  |  |
|---|---|---|---|---|---|
|  | Peel angle φ1 (°) (method I) | 55 | 165 | 55 | 90 |
|  | Peel angle φ2 (°) (method II) | 125 | 15 | 125 | 90 |
|  | Peel strength (N/cm) (method I) | 0.21 | 2 | 0.15 | 0.2 |
|  | Peel strength (N/cm) (method II) | 0.16 | 5 | 0.10 | 0.12 |
| Protective film | Protective film | Apical 125NPI | Apical 125NPI | Apical 125NPI | Apical 125NPI |
|  | Thickness (μm) | 125 | 125 | 125 | 125 |
|  | β (°) | 30 | 30 | 165 | 90 |
|  | Peel angle θ1 (°) (method I) | 30 | 30 | 165 | 90 |
|  | Peel angle θ2 (°) (method II) | 150 | 150 | 15 | 90 |
|  | Peel strength (N/cm) (method I) | 0.12 | 0.12 | 2.5 | 0.18 |
|  | Peel strength (N/cm) (method II) | 0.1 | 0.1 | 5.5 | 0.11 |
|  | Peelability of protective material | ○ | X | ◎ | X |
|  | Peelability of protective film | ◎ | ◎ | X | X |
|  | Warping in obtained single-sided metal-clad laminate | ◎ | X | X | X |

INDUSTRIAL APPLICABILITY

By employing conventionally used materials and apparatuses for a double-sided metal-clad laminate, the method and apparatus for manufacturing a single-sided metal-clad laminate related to the present invention are capable of manufacturing a single-sided metal-clad laminate without causing trouble such as the surface of a thermoplastic resin layer having no laminated metal foil melting and sticking to metallic rolls or protective film, thereby making it easier to obtain at lower cost a single-sided metal-clad laminate which is suppressed from warping. Accordingly, the manufacturing method and manufacturing apparatus are preferably used in manufacturing a single-sided metal-clad laminate suitable for applications as a printed circuit board of electronic/electrical devices.

DESCRIPTION OF NUMERICAL REFERENCES 1 heat-resistant film (A)
2 thermoplastic resin layer (B)
3 adhesive sheet (C)
4 metal foil (D)
5 single-sided metal-clad laminate (E)
6 protective film (F)
7 protective material (G)
8 double-sided metal-clad laminate
9 paired metallic rolls
10 paired peel rolls
11 heater
12 peel roll
13 double-sided tape
14 substrate
15 stand

What is claims is:

1. A method of manufacturing a single-sided metal-clad laminate, the method comprising:
    laminating a metal foil on a first thermoplastic resin layer formed on a first surface of a heat-resistant film;
    laminating a protective material on a second thermoplastic resin layer formed on a second surface of the heat-resistant film having no metal foil laminated thereon, wherein the laminating of the protective material comprises thermocompression bonding;
    peeling the protective material such that a single-sided metal-clad laminate comprising an adhesive sheet having the first and second thermoplastic resin layers on the heat-resistant film is formed,
    prior to the themocompression bonding, heating the adhesive sheet at a temperature of from 300° C. to 550° C., and
    wherein the peeling is conducted such that a peeled protective material and the single-sided metal-clad laminate prior to the peeling form an angle (α) of greater than 0° and smaller than 90°.

2. The method of claim 1, further comprising:
    laminating a protective film directly on the metal foil; and peeling the protective film,
    wherein the peeling of the protective film is conducted such that a peeled protective film and the single-sided metal-clad laminate prior to the peeling of the protective film form an angle (β) of greater than 0° and smaller than 90°.

3. The method of claim 2, wherein the peeling of the protective material is conducted before the peeling of the protective film.

4. The method of claim 2, wherein the laminating of the protective film comprises thermocompression bonding.

5. The method of claim 4, wherein the thermocompression bonding is conducted with at least one pair of metallic rolls.

6. The method of claim 4, wherein the thermocompression bonding is conducted at a compression bonding temperature T1 which is 20° C. to 90° C. higher than a glass transition temperature T2 of the first or second thermoplastic resin layer.

7. The method of claim 2, wherein the peeling of the protective material, or the peeling of the protective material and the protective film, from the single-sided metal-clad laminate is performed at a speed of 3.5 m/min or slower.

8. The method of claim 2, wherein the peeling of the protective material, or the peeling of the protective material and the protective film is conducted by a pair of peel rolls having a radius ratio ra/rb of smaller than 1,
    wherein ra is a radius of one of the peel rolls on a to-be-peeled protective material side, or on a to-be-peeled protective film side, and rb is a radius of the other of the peel rolls of the pair on an opposing single-sided metal-clad laminate side.

9. The method of claim 1, wherein the protective material satisfies |X1-X2|≥3 ppm/° C.,
    where X1 is a linear expansion coefficient of the adhesive sheet, and X2 is a linear expansion coefficient of the protective material.

10. The claim 1, wherein the protective material has a surface roughness of from 0.01 μm to 3 μm.

11. The method of claim 1, wherein the heat-resistant film comprises a non-thermoplastic polyimide film.

12. The method of claim 1, wherein the first or second thermoplastic resin layer comprises a thermoplastic polyimide resin.

* * * * *